US007384530B2

(12) United States Patent
Cohen et al.

(10) Patent No.: US 7,384,530 B2
(45) Date of Patent: Jun. 10, 2008

(54) METHODS FOR ELECTROCHEMICALLY FABRICATING MULTI-LAYER STRUCTURES INCLUDING REGIONS INCORPORATING MASKLESS, PATTERNED, MULTIPLE LAYER THICKNESS DEPOSITIONS OF SELECTED MATERIALS

(75) Inventors: Adam L. Cohen, Los Angeles, CA (US); Dennis R. Smalley, Newhall, CA (US)

(73) Assignee: Microfabrica Inc., Van Nuys, CA (US)

( * ) Notice: Subject to any disclaimer, the term of this patent is extended or adjusted under 35 U.S.C. 154(b) by 890 days.

(21) Appl. No.: 10/841,001

(22) Filed: May 7, 2004

(65) Prior Publication Data
US 2005/0023144 A1 Feb. 3, 2005

Related U.S. Application Data

(63) Continuation-in-part of application No. 10/434,519, filed on May 7, 2003, now Pat. No. 7,252,861.

(60) Provisional application No. 60/468,908, filed on May 7, 2003, provisional application No. 60/379,130, filed on May 7, 2002.

(51) Int. Cl.
C25D 5/02 (2006.01)
C25D 5/48 (2006.01)

(52) U.S. Cl. .................... 205/118; 205/223; 216/72
(58) Field of Classification Search ............... 205/118, 205/149, 170, 205, 220, 222, 223; 427/532, 427/576, 99.3; 216/39, 72
See application file for complete search history.

(56) References Cited

U.S. PATENT DOCUMENTS

| 3,620,933 A | 11/1971 | Grunwald et al. .......... 205/125 |
| 5,190,637 A | 3/1993 | Guckel ....................... 205/118 |
| 5,824,374 A | 10/1998 | Bradley, Jr. et al. ........ 427/555 |

(Continued)

FOREIGN PATENT DOCUMENTS

EP 0 567 332 A2 10/1993

OTHER PUBLICATIONS

Cohen, et al., "EFAB: Batch Production of Funtional, Fully-Dense Metal Parts with Micron-Scale Features", Proc. 9th Solid Freeform Fabrication, The University of Texas at Austin, Aug. 1998, pp. 161.

(Continued)

*Primary Examiner*—Nam Nguyen
*Assistant Examiner*—Luan V. Van
(74) *Attorney, Agent, or Firm*—Dennis R. Smalley

(57) ABSTRACT

The invention includes methods of fabrication and apparatuses. In at least some embodiments of the applicants' invention, the methods include processes of: maskless selective deposition of non-layered structures, selective etching and/or deposition without use of a separate mask and/or lithography techniques, retaining selected portions of sacrificial material during removal (e.g. etching) of other portions of sacrificial material, depositing materials other than the structural and sacrificial materials, including more than one type of structural and/or sacrificial material, and fabrication of interlacing elements. Embodiments of the methods of the invention provide increased capabilities, properties, flexibility and in the fabrication of three-dimensional structures by electro-deposition or other techniques. In certain embodiments, the apparatuses of the invention include structures having non-layered elements, retained sacrificial materials, three or more different deposited materials, and interlaced elements.

15 Claims, 17 Drawing Sheets

U.S. PATENT DOCUMENTS

| | | | | |
|---|---|---|---|---|
| 6,027,630 | A | 2/2000 | Cohen | 205/135 |
| 6,197,181 | B1 | 3/2001 | Chen | 205/123 |
| 6,235,624 | B1 | 5/2001 | Sasaki et al. | 438/618 |
| 6,287,968 | B1 | 9/2001 | Yu et al. | 438/675 |
| 6,355,147 | B1 | 3/2002 | Griffiths et al. | 204/242 |
| 6,562,656 | B1 | 5/2003 | Ho | 438/107 |
| 7,252,861 | B2 | 8/2007 | Smalley | 427/264 |
| 2001/0014409 | A1 | 8/2001 | Cohen | 428/606 |
| 2001/0024872 | A1 | 9/2001 | Miyamoto | 257/737 |
| 2002/0020628 | A1 | 2/2002 | Basol | 205/118 |
| 2002/0185311 | A1 | 12/2002 | Cohn | 205/125 |
| 2005/0079666 | A1 | 4/2005 | French et al. | 438/800 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

Harshbarger, Eric, "The Desk . . . ", http://www.ericharshbarger.org/lego/desk, Aug. 25, 2000.

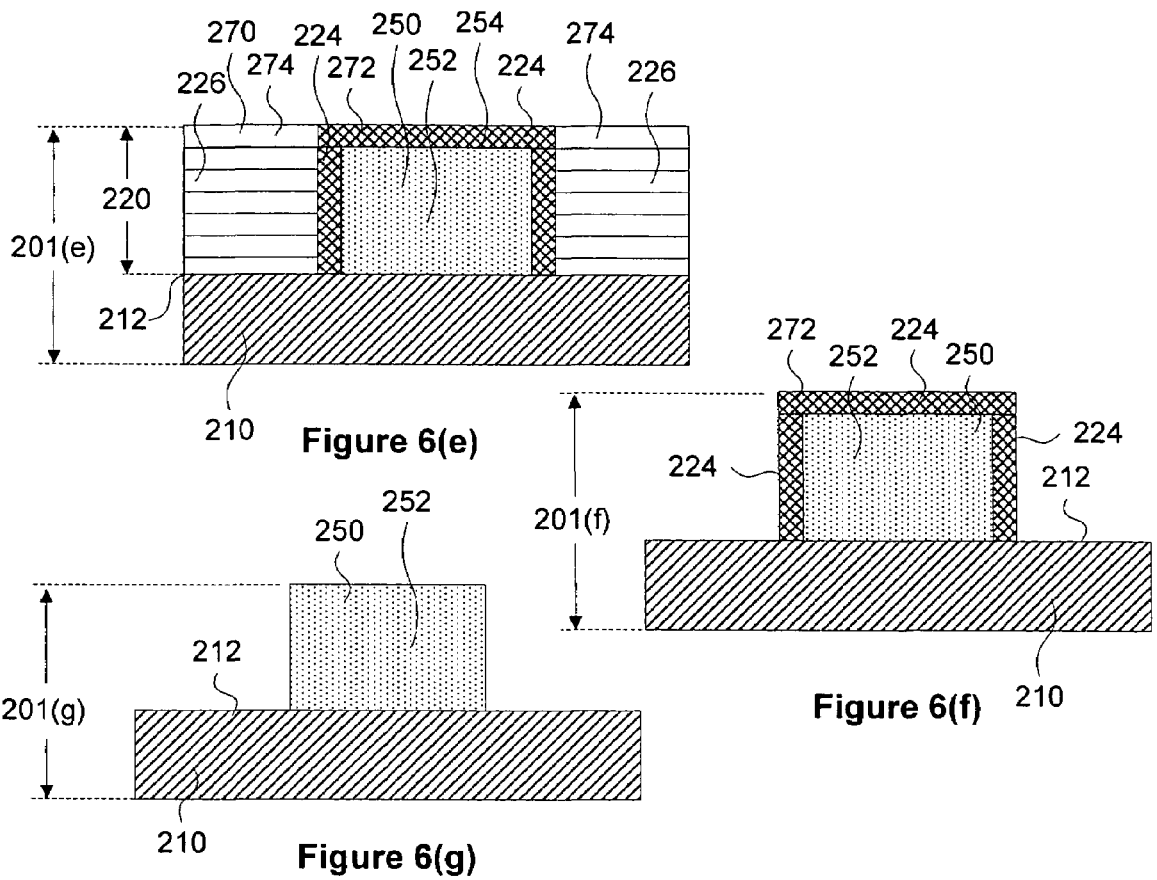
Figure 6(e)
Figure 6(f)
Figure 6(g)
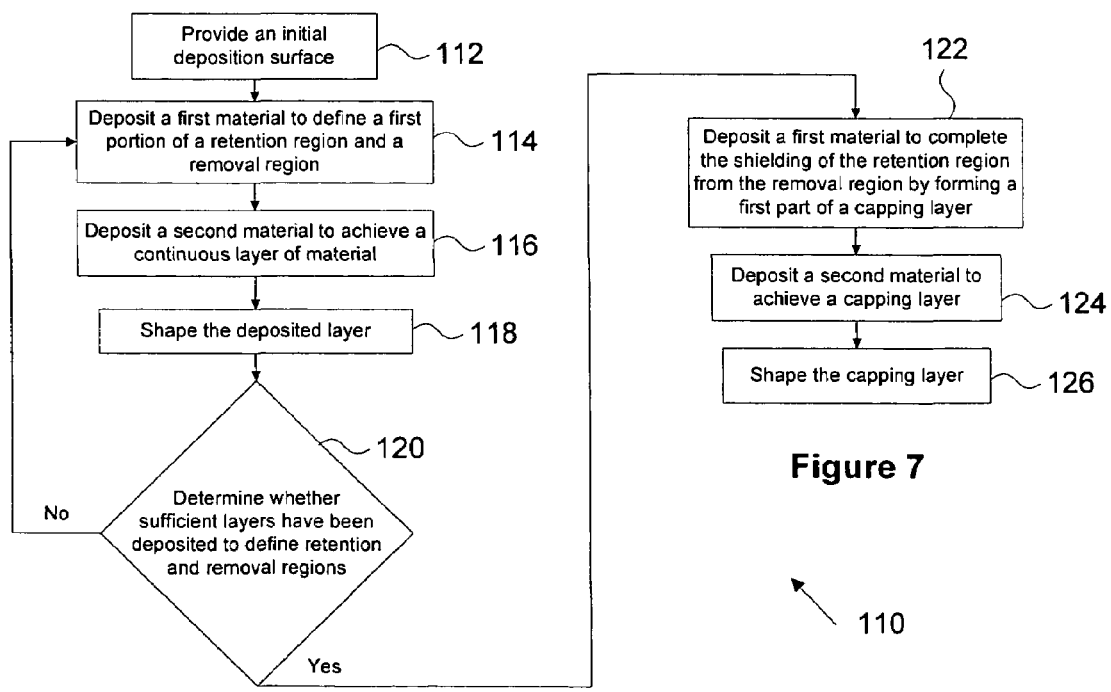
Figure 7

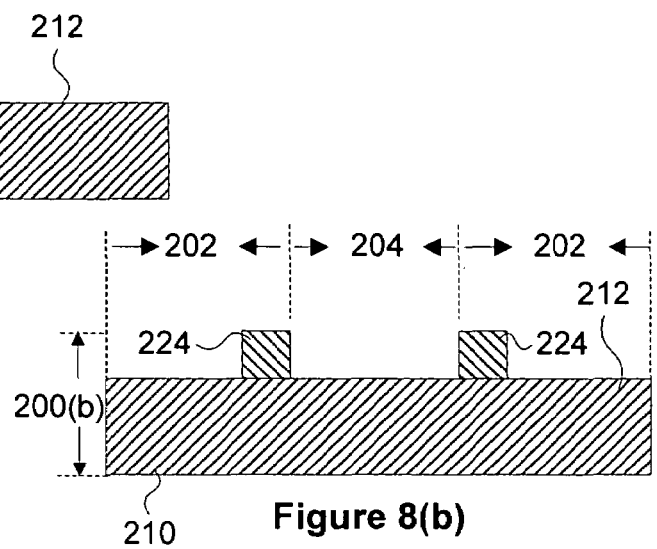
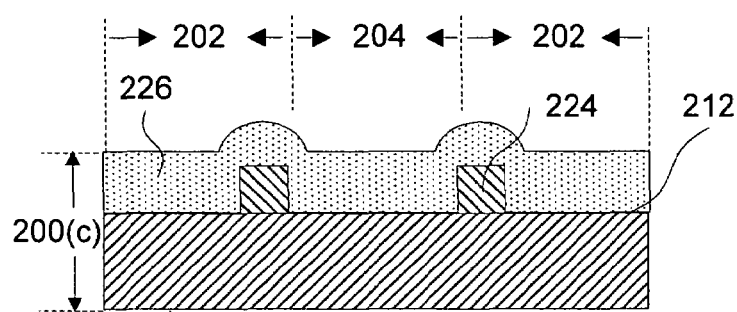
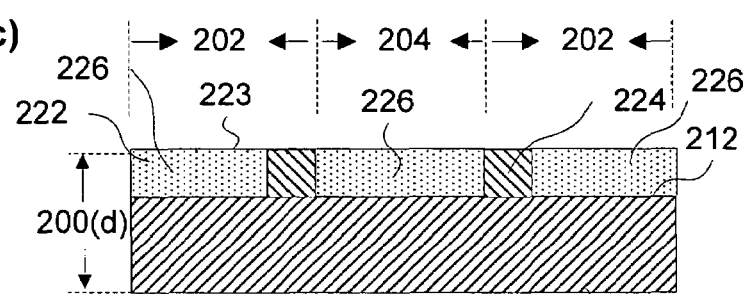
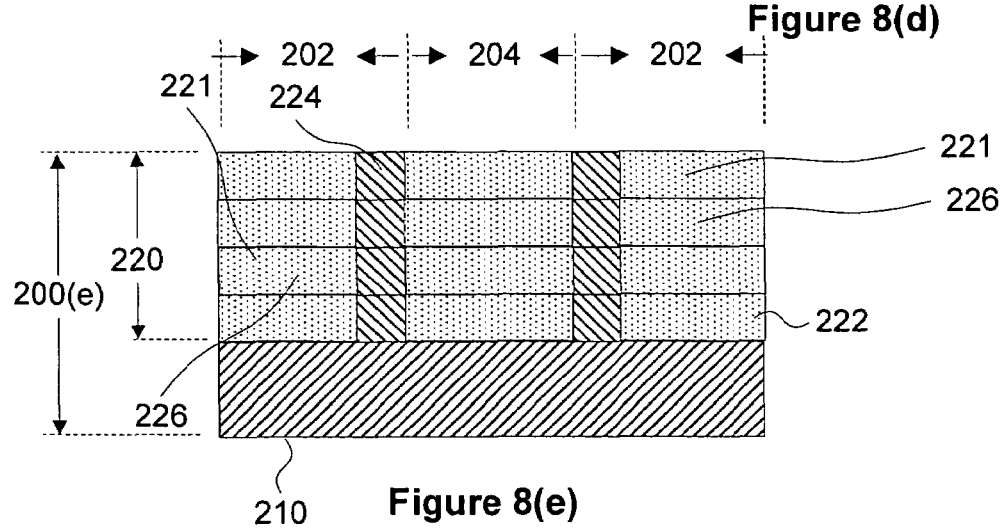
Figure 8(a)
Figure 8(b)
Figure 8(c)
Figure 8(d)
Figure 8(e)

METHODS FOR ELECTROCHEMICALLY FABRICATING MULTI-LAYER STRUCTURES INCLUDING REGIONS INCORPORATING MASKLESS, PATTERNED, MULTIPLE LAYER THICKNESS DEPOSITIONS OF SELECTED MATERIALS

RELATED APPLICATIONS

This application is a continuation-in-part of U.S. patent application Ser. No. 10/434,519 filed May 7, 2003 now U.S. Pat. No. 7,252,861 and claims benefit of U.S. Provisional Patent Application No. 60/468,908, filed on May 7, 2003; the '519 application in turn claims benefit of U.S. Provisional Patent Application Ser. No. 60/379,130, filed May 7, 2002. These referenced applications are hereby incorporated herein by reference as if set forth in full herein.

FIELD OF THE INVENTION

The embodiments of various aspects of the invention relate generally to the electrochemical fabrication of three-dimensional structures via a layer-by-layer build up of deposited materials wherein at least portions of some structures are formed from depositions of material that fill voids made in bounded volumes of previously deposited material that are multiple layer thicknesses in depth, or alternatively are formed from depositions of material that (1) are formed without masking that specifically dictates deposition location, (2) are formed to have patterned configuration, and (3) have thicknesses which are multiple layer thicknesses in height.

BACKGROUND

A technique for forming three-dimensional structures (e.g. parts, components, devices, and the like) from a plurality of adhered layers was invented by Adam L. Cohen and is known as Electrochemical Fabrication. It is being commercially pursued by Microfabrica® Inc. (formerly MEMGen® Corporation) of Van Nuys, Calif. under the name EFAB®. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica® Inc. (formerly MEMGen Corporation) of Van Nuys, Calif. such masks have come to be known as INSTANT MASKS™ and the process known as INSTANT MASKING or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, August, 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p244, January, 1999.

(3) A. Cohen, "3-D Micromachining by Electrochemical Fabrication", Micromachine Devices, March, 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April, 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST '99), June, 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September, 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFABTM)", Chapter 19 of The MEMS Handbook, edited by Mohamed Gad-El-Hak, CRC Press, 2002.

(9) "Microfabrication—Rapid Prototyping's Killer Application", pages 1-5 of the Rapid Prototyping Report, CAD/CAM Publishing, Inc., June, 1999

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.

2. Then, blanket depositing at least one additional material by electrodeposition so that the additional deposit covers both the regions that were previously selectively deposited onto, and the regions of the substrate that did not receive any previously applied selective depositions.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1(a)-1(c). FIG. 1(a) shows a side view of a CC mask 8 consisting of a conformable or deformable (e.g. elastomeric) insulator 10 patterned on an anode 12. The anode has two functions. FIG. 1(a) also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation.

CC mask plating selectively deposits material 22 onto a substrate 6 by simply pressing the insulator against the substrate then electrodepositing material through apertures 26a and 26b in the insulator as shown in FIG. 1(b). After deposition, the CC mask is separated, preferably non-destructively, from the substrate 6 as shown in FIG. 1(c). The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1(d)-1(f). FIG. 1(d) shows an anode 12' separated from a mask 8' that includes a patterned conformable material 10' and a support structure 20. FIG. 1(d) also depicts substrate 6 separated from the mask 8'. FIG. 1(e) illustrates the mask 8' being brought into contact with the substrate 6. FIG. 1(f) illustrates the deposit 22' that results from conducting a current from the anode 12' to the substrate 6. FIG. 1(g) illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2(a)-2(f). These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2(a), illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG.

2(b). FIG. 2(c) depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2(d). After repetition of this process for all layers, the multi-layer structure 20 formed of the second material 4 (i.e. structural material) is embedded in first material 2 (i.e. sacrificial material) as shown in FIG. 2(e). The embedded structure is etched to yield the desired device, i.e. structure 20, as shown in FIG. 2(f).

Various components of an exemplary manual electrochemical fabrication system 32 are shown in FIGS. 3(a)-3(c). The system 32 consists of several subsystems 34, 36, 38, and 40. The substrate holding subsystem 34 is depicted in the upper portions of each of FIGS. 3(a) to 3(c) and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3(a) includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3(b) and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3(c) and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

SUMMARY OF THE INVENTION

It is an object of some aspects of the invention to provide improved electrochemical fabrication methods.

It is an object of some aspects of the invention to provide electrochemical fabrication methods that allow a wider range of materials to be incorporated into structures that are formed.

It is an object of some aspects of the invention to provide three-dimensional structures with improved properties.

Other objects and advantages of various aspects of the invention will be apparent to those of skill in the art upon review of the teachings herein. The various aspects of the invention, set forth explicitly herein or otherwise ascertained from the teachings herein, may address one or more of the above objects alone or in combination, or alternatively they may address some other object of the invention that may be ascertained from the teachings herein. It is not necessarily intended that all objects be addressed by any single aspect of the invention even though that may be the case with regard to some aspects.

Embodiments of the invention include methods of fabrication and apparatus. In at least some embodiments of the invention, the methods include processes of maskless selective deposition of non-layered structures, selective etching and/or deposition without use of a separate mask and/or lithography techniques, retaining selected portions of sacrificial material during removal (e.g. etching) of other portions of sacrificial material, depositing materials other than the structural and sacrificial materials, including more than one type of structural and/or sacrificial material, and fabrication of interlacing elements. Some embodiments of the invention provide increased capabilities, properties and flexibility in the fabrication of three-dimensional structures by electrodeposition or other techniques. In certain embodiments, the apparatuses of the invention include structures having non-layered elements, retained sacrificial materials, three or more different deposited materials, and interlaced elements.

In a first aspect of the invention, a method for forming a three-dimensional structure, includes: (a) providing a substrate on which to build up multiple layers of multiple deposited materials; (b) depositing one or more materials to form a layer of desired cross-sectional configuration adhered to the substrate or a previous formed layer; (c) repeating the operation of (b) one or more times to build up a plurality of layers on the substrate, such that each layer has a desired cross-sectional configuration which when taken in combination with other cross-sectional configurations result in the formation of at least one removal region, occupied by at least one removable material, that is multiple layers in thickness and that is in contact with a retention region where the contact between the at least one retention region and the at least one removal regions is via a barrier material, (d) removing material from the at least one removal region by a removal operation to form at least one multi-layer deposition region while not removing material from the at least one retention region as the barrier material inhibits the removal operation from accessing and removing any removable material located in the at least one retention region; and(e) filling the deposition region with a desired structural material.

In a second aspect of the invention, a method for forming a three-dimensional from a structural material, includes: (a) forming a plurality of layers of multiple materials in a desired configuration, where at least one region of a first material is separated from at least one region of a second material by a barrier material; (b) etching away the first material from the at least one region of first material, to create at least one void, wherein etching is inhibited from removing the second material as a result of the second material being protected, at least in part, as a result of the configuration of the barrier material; and (c) filling the at least one void with a structural material having a desired three-dimensional configuration.

In a third aspect of the invention, a method of fabricating a three-dimensional structure, includes: (a) providing a layered structure defining a retention region and a removal region, wherein the removal regions has a desired pattern and wherein the retention region includes a first material positioned to shield a second material, wherein the removal region includes the second material; (b) removing the second material from the removal region, without removing the second material from the retention region, to form a deposition region; (c) depositing a desired material into the deposition region to form a region of desired material which has a thickness greater than one layer thickness; and (d) planarizing the deposited desired material, such that the thickness of the desired material remains greater than one layer thickness and such that a desired configuration of the desired material is obtained.

In a fourth aspect of the invention, a method of fabricating a multi-layer structure, includes: (a) providing an initial deposition surface; (b) defining locations for a plurality of layers where at least a first material will be located and where at least a second material will be located, (c) forming a plurality of layers containing the first and second materials by depositing the first and second materials such that they are located in regions according to the defined locations and wherein the materials define at least one retention region and at least one removal region; (d) removing a portion of the first material from the at least one removal region to form at least one multi-layer deposition region; (e) depositing at least one desired material to fill the multi-layer deposition region; (f) depositing a capping layer over the multi-layer material; and (g) removing at least a portion of the remaining first material.

In a fifth aspect of the invention, a method for fabricating a three-dimensional structure having interlaced elements includes: (a) providing a layered structure having defined retention and removal regions; (b) removing material from the removal regions to form deposition regions; (c) depositing a non-layered material into the deposition regions to form a composite structure; (d) shaping the composite structure; (e) removing layered structure to define interlace deposition region(s); (f) depositing a sacrificial material to define an interface removal region; (g) shaping the sacrificial material to define an interlace removal region; (h) removing the sacrificial material; and (i) depositing a non-layered capping structure.

In a sixth aspect of the invention, a method for fabricating extended interlaced elements includes: (a) providing a first layered structure having defined retention and removal regions; (b) removing material from the removal region(s) to form first deposition regions; (c) depositing a non-layered material into the deposition region(s) to form a first composite structure; (d) shaping the first composite structure; (e) providing a second layered structure having defined retention and removal regions; (f) removing material from the removal region of the second layered structure to define second deposition regions; (g) depositing a non-layered material into the second deposition regions to form a second composite structure; (h) shaping the second composite structure; and (i) removing the remaining portions of the first and second layered structures.

Further aspects of the invention will be understood by those of skill in the art upon reviewing the teachings herein. Other aspects of the invention may involve combinations of the above noted aspects of the invention. Other aspects of the invention may involve apparatus that are configured to implement one or more of the above method aspects of the invention. These other aspects of the invention may provide various combinations of the aspects presented above as well as provide other configurations, structures, functional relationships, and processes that have not been specifically set forth above.

BRIEF DESCRIPTION OF THE DRAWINGS

FIGS. 6(a)-(g) provide schematic side views illustrating various states in the formation of a sample structure according the method of FIG. 5

FIG. 7 is a flowchart of a method in accordance with a second embodiment of the invention.

FIGS. 8(a)-(h) are provide schematic side views illustrating various states in the formation of a sample structure according the method of FIG. 7.

DETAILED DESCRIPTION OF PREFERRED EMBODIMENTS

FIGS. 1(a)-1(g), 2(a)-2(f), and 3(a)-3(c) illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the invention explicitly set forth herein to yield enhanced embodiments. Still other embodiments may be derived from combinations of the various embodiments explicitly set forth herein.

Figure 1A:
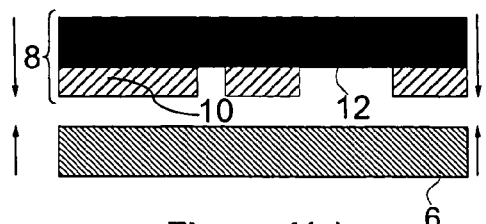
FIGS. 1(a)-1(c) schematically depict side views of various stages of a CC mask plating process, while FIGS. 1(d)-(g) schematically depict a side views of various stages of a CC mask plating process using a different type of CC mask.
Figure 1B:
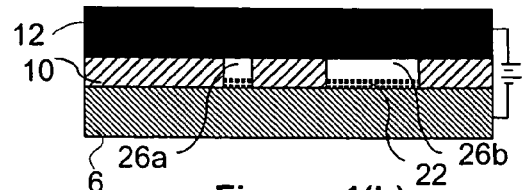
Figure 1C:
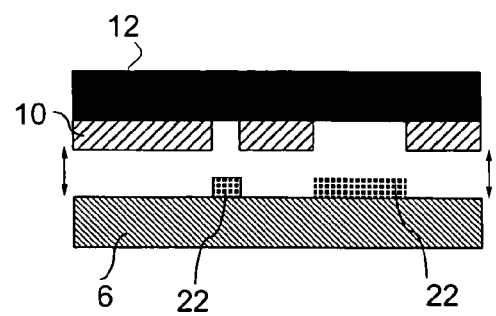
Figure 1D:
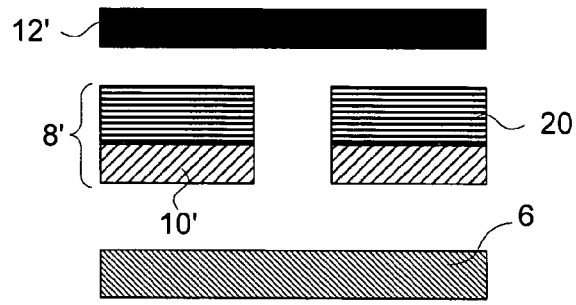
Figure 1E:
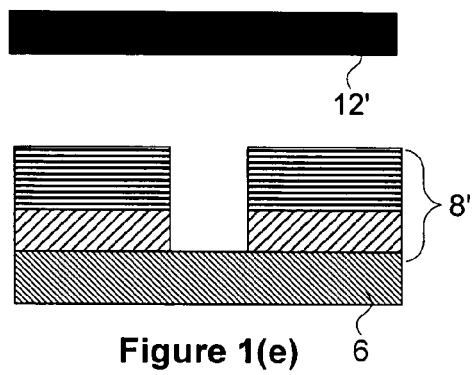
Figure 1F:
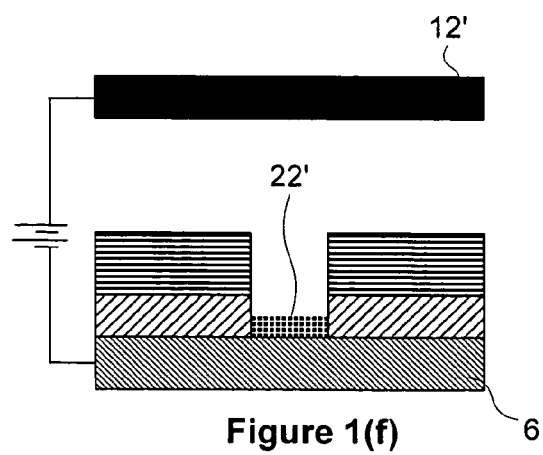
Figure 1G:
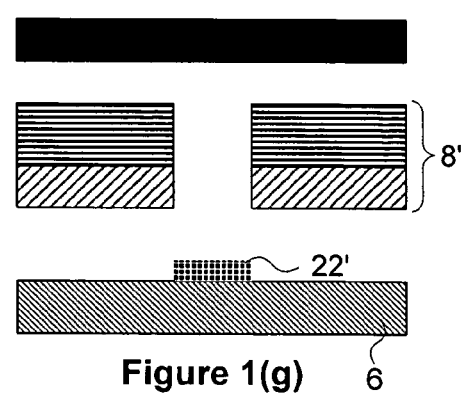
Figure 2A:
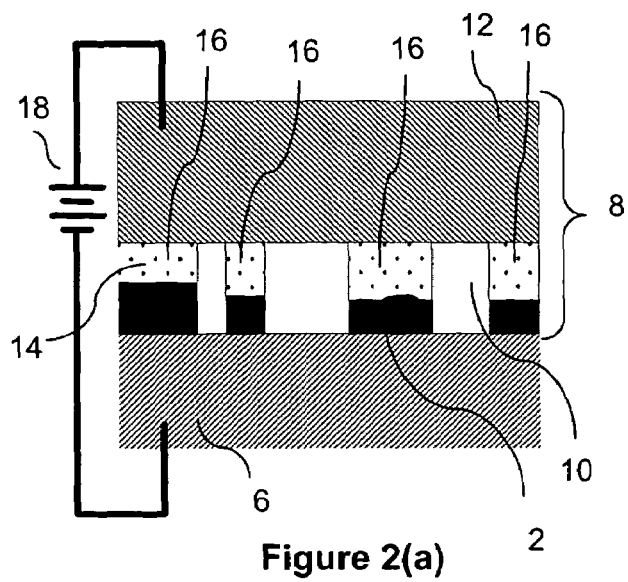
FIGS. 2(a)-2(f) schematically depict side views of various stages of an electrochemical fabrication process as applied to the formation of a particular structure where a sacrificial material is selectively deposited while a structural material is blanket deposited.
Figure 2B:
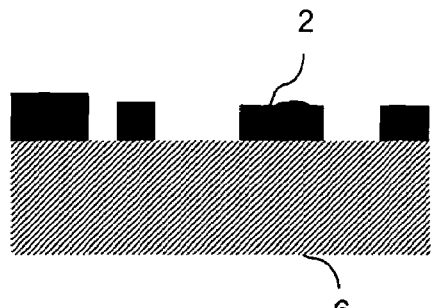
Figure 2C:
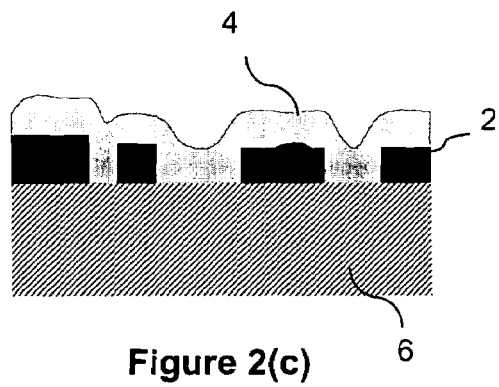
Figure 2D:
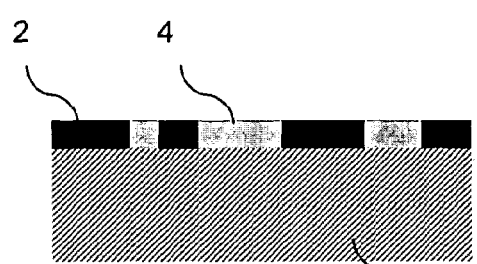
Figure 2E:
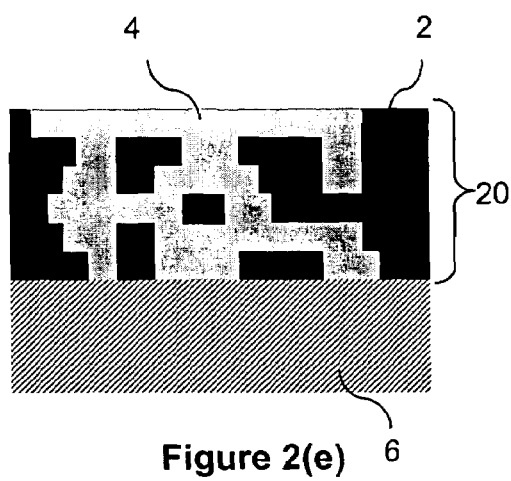
Figure 2F:
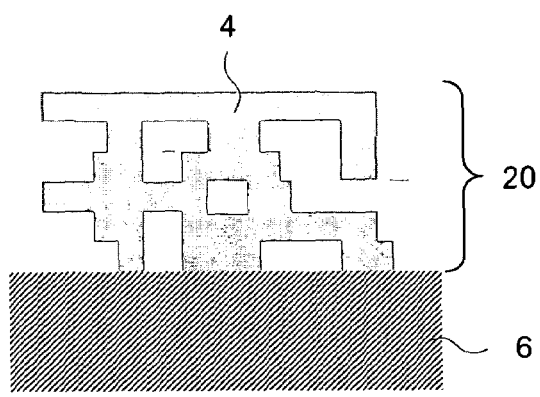
Figure 3A:
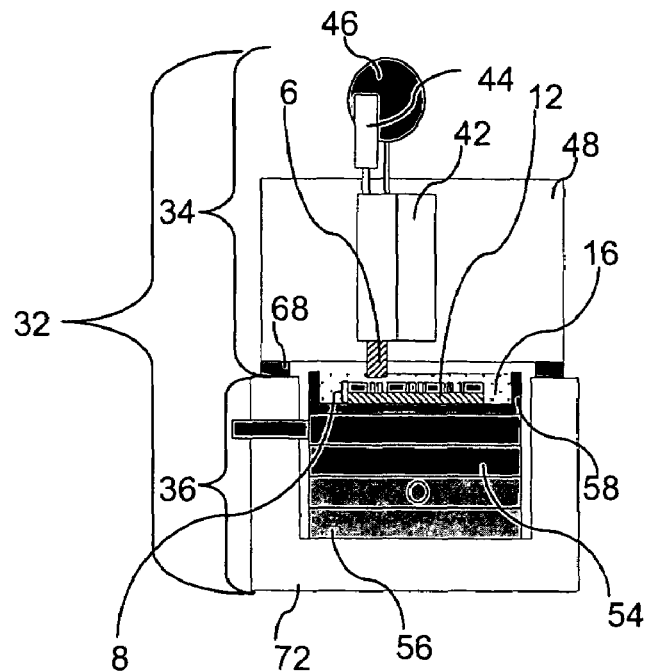
FIGS. 3(a)-3(c) schematically depict side views of various example subassemblies that may be used in manually implementing the electrochemical fabrication method depicted in FIGS. 2(a)-2(f).
Figure 3B:
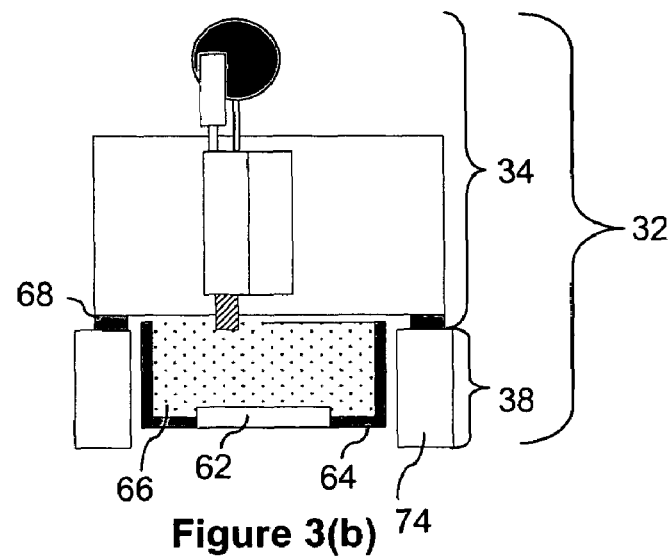
Figure 3C:
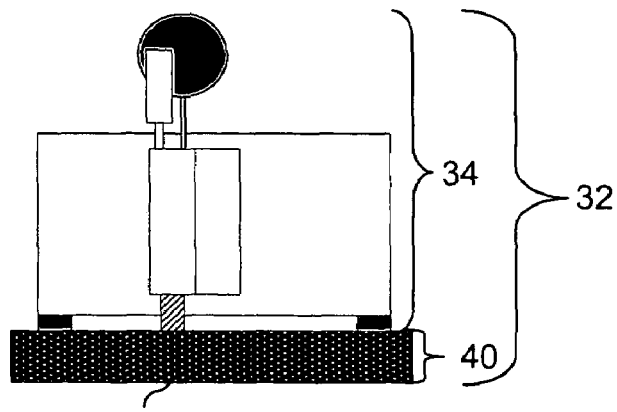
Figure 4A:
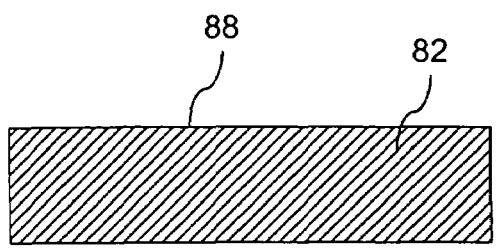
FIGS. 4(a)-4(f) schematically depict the formation of a first layer of a structure using adhered mask plating where the blanket deposition of a second material overlays both the openings between deposition locations of a first material and the first material itself.
Figure 4B:
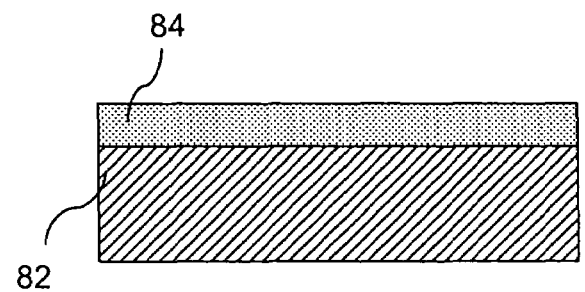
Figure 4C:
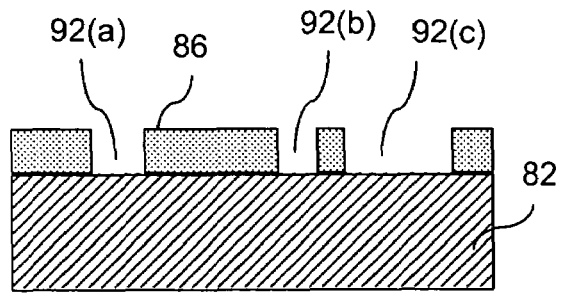
Figure 4D:
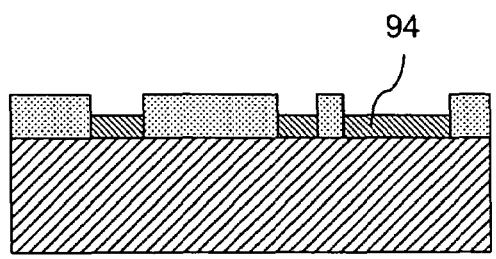
Figure 4E:
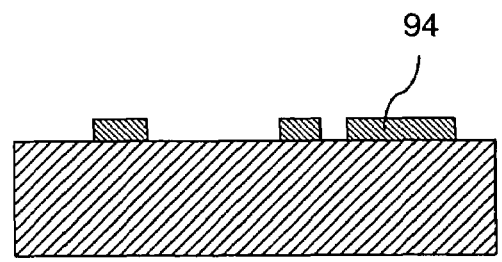
Figure 4F:
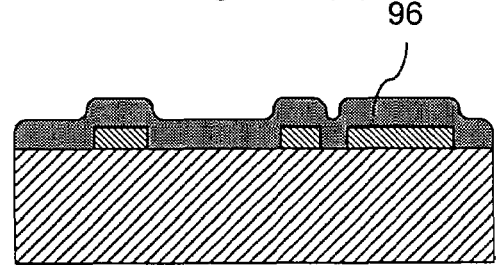
Figure 4G:
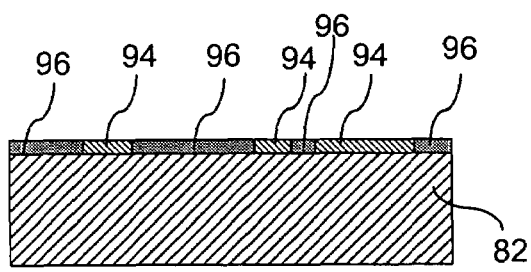
FIG. 4(g) depicts the completion of formation of the first layer resulting from planarizing the deposited materials to a desired level.
Figure 4H:
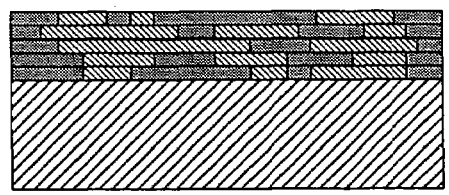
FIGS. 4(h) and 4(i) respectively depict the state of the process after formation of the multiple layers of the structure and after release of the structure from the sacrificial material.
Figure 4I:
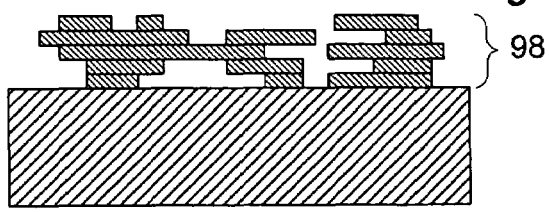

FIGS. 4(a)-4(i) illustrate various stages in the formation of a single layer of a multi-layer fabrication process where a second metal is deposited on a first metal as well as in openings in the first metal where its deposition forms part of the layer. In FIG. 4(a), a side view of a substrate 82 is shown, onto which patternable photoresist 84 is cast as shown in FIG. 4(b). In FIG. 4(c), a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4(d), a metal 94 (e.g. nickel) is shown as having been electroplated into the openings 92(a)-92(c). In FIG. 4(e), the photoresist has been removed (i.e. chemically stripped) from the substrate to expose regions of the substrate 82 which are not covered with the first metal 94. In FIG. 4(f), a second metal 96 (e.g., silver) is shown as having been blanket electroplated over the entire exposed portions of the substrate 82 (which is conductive) and over the first metal 94 (which is also conductive). FIG. 4(g) depicts the completed first layer of the structure which has resulted from the planarization of the first and second metals down to a height that exposes the first metal and sets a thickness for the first layer. In FIG. 4(h) the result of repeating the process steps shown in FIGS. 4(b)-4(g) several times to form a multi-layer structure are shown where each layer consists of two materials. For most applications, one of these materials is removed as shown in FIG. 4(i) to yield a desired 3-D structure 98 (e.g. component or device).

Various embodiments of some aspects of the invention are directed to formation of three-dimensional structures from materials some of which may be electrodeposited. These structures are formed from a plurality of layers of deposited materials (e.g. 2 or more layers, more preferably five or more layers, and most preferably ten or more layers). In some embodiments structures having features positioned with micron level precision and minimum features size on the order of tens of microns are to be formed. In other embodiments structures with less precise feature placement and/or larger minimum features may be formed. In still other embodiments, higher precision and smaller minimum feature sizes may be desirable.

Various embodiments to be discussed herein after may be focused primarily on a particular type of masking technique for selective patterning of deposited materials. However, each embodiment may have alternatives that are implementable with other patterning techniques. These embodiments and alternatives may perform selective patterning operations using conformable contact masks and masking operations, proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Adhered masks may be formed in a number of ways including, for example (1) by application of a photoresist, selective exposure of the photoresist, and then development of the photoresist, (2) selective transfer of pre-patterned masking material, and/or (3) direct formation of masks from computer controlled depositions of material. Selective patterning using masks may occur by depositing a selected material into voids or openings in the masks or it occur by selectively etching a surface of an already deposited material using the mask. In other applications, selective patterning may not involve a significant height of deposition of material or significant depth of etching of material but instead may involve treating a surface in a selective manner, e.g. selective microetching of a surface (e.g. to improve adhesion between it and a material), selective oxidization of a surface (e.g. to change its conductivity), selective chemical treatment of a surface (e.g. in preparation for an electroless deposition), and the like.

Some embodiments of the invention provide methods for building structures and removing material without the need for all the steps and components typically utilized in prior methods. More specifically, the present methods: allow the deposition of non-layered materials, provide the ability to perform selective etching and/or deposition without requiring use of an independent mask and/or lithography techniques, offer the option of retaining selected portions of sacrificial material during removal (e.g. etching) of the material, and permit the deposition of materials in addition to the typical structural and sacrificial materials, including the incorporation of more than one structural and/or sacrificial type of material. In so doing, some embodiments of the invention provide increased capabilities, flexibility and options in the electrochemical fabrication of three-dimensional structures.

Figure 5:
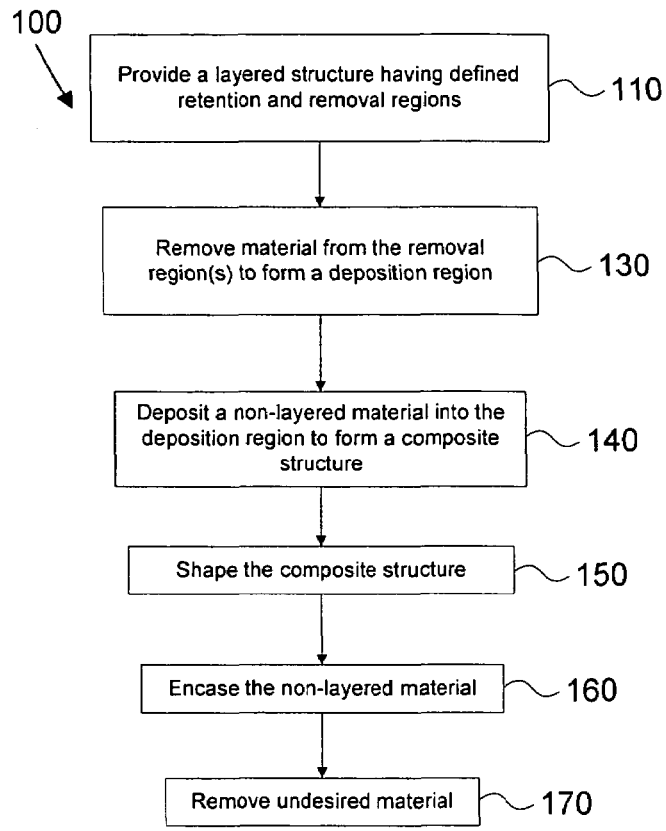
FIG. 5 is a flowchart of a method in accordance with a first embodiment of the invention.

A first embodiment of the invention is set out in the flowchart of FIG. 5. This first embodiment provides a method for forming a structure that includes a portion formed in a non-layered manner via a selective deposition operation. As shown in FIG. 5, a fabrication method 100 includes (1) providing a layered structure having defined retention and removal regions, block 110; (2) removing material from the removal region(s) to form a deposition region, block 130; (3) depositing a non-layered material into the deposition region to form a composite structure, block 140; (4) shaping the composite structure, block 150; (5) encasing the non-layered material, block 160; and (6) removing undesired material, block 170.

FIGS. 6(a)-(g) set forth an example of a structure that may be formed according to the operations of the method 100 of FIG. 5. As further detailed herein, alternative embodiments can involve performing less than all of the operations of method 100, performing additional operations, and/or performing alternate operations.

Providing a Layered Structure Having Retention and Removal Regions:

The first operation in the fabrication process of method 100 is providing a layered structure having defined retention and removal regions 110. One example of such a layered structure is structure 201(a) shown in FIG. 6(a).

Figure 6A:
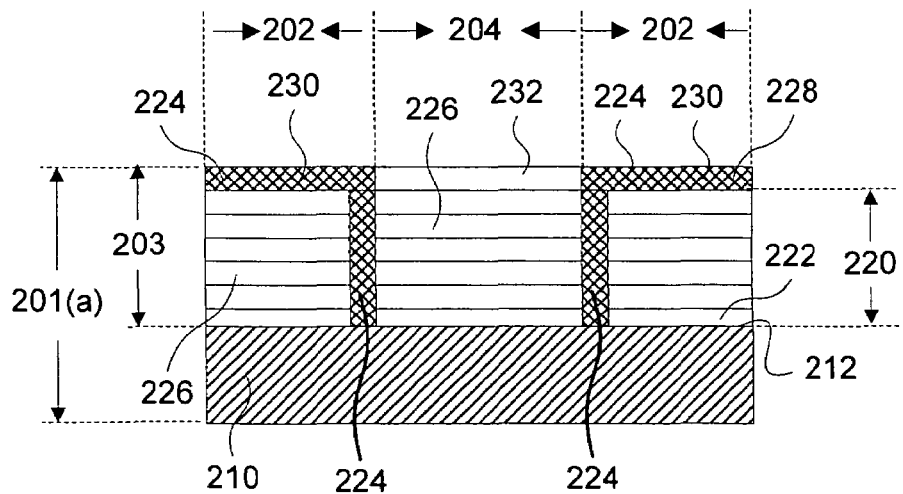
Figure 6B:
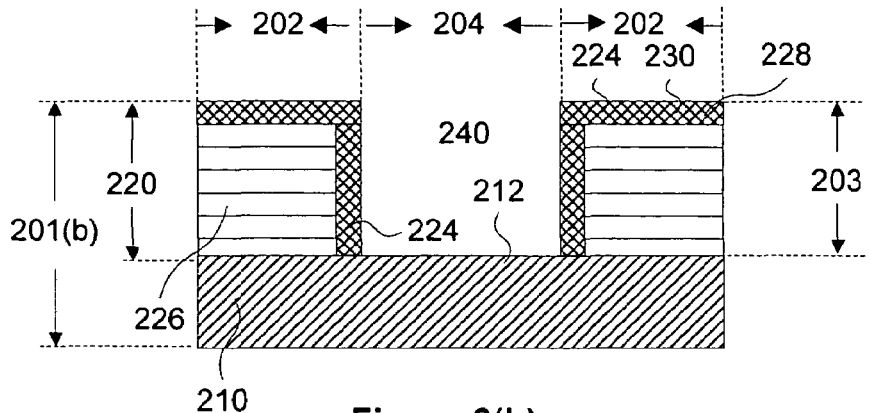
Figure 6C:
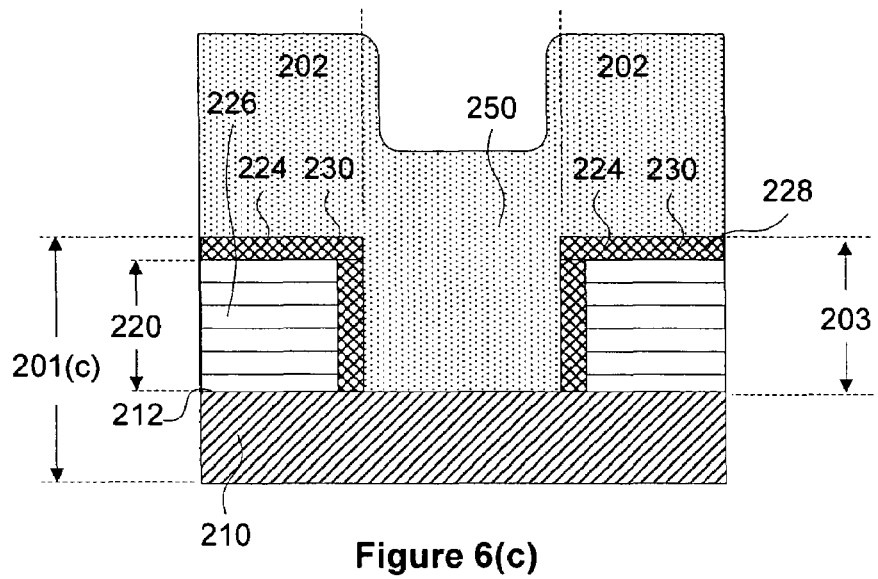

FIG. 6(a) shows a layered structure 201(a) having defined retention regions 202 and a removal region 204. As will be further described herein, the retention regions 202 are configured to remain after the removal operation of block 130 (e.g. a chemical or electrochemical etching operation) which removes the removal region 204 as shown in FIG. 6(b). In this manner, the structure 201(a) is built up and configured in such a manner so as to allow for the later formation of a deposition area 240 for receiving a non-layered structure. In some embodiments, as in this embodiment, the deposition region may be the region that is emptied by the removal operation of block 130.

Returning to FIG. 6(a), the structure 201(a) includes a substrate 210 and a plurality or series of layers 220. The substrate 210 includes a deposition surface 212 upon which an initial or base layer 222 is deposited. Each of the layers 220 includes regions of a first material 224 and a second material 226. The sections of first material 224 are positioned in the retention regions 202, about and abutting the removal region 204. The second material 226 is positioned both within the retention region 202 and the removal region 204. The removal region is made only of the second material 226.

Over layers 220, which extend through most of the removal region, is a final or capping layer 228 which differs from the configuration of layers 220, in that the capping layer 228 has first material capping sections 230 which extend outward from abutting the removal region 204 and over the respective portions of the retention regions 202. In others words, capping layer 228 forms a relatively thin horizontal extending shield of the first material 224 while layers 220 taken together (at least in the example shown) provide primarily a relatively narrow vertical extending shield of material 224. On layer 228, set between the first material sections 230 is a second material section 232. The first material 224 is configured to extend continuously from the substrate 210, abutting the removal region 204, up to the final layer 228 and outward to cover those portions of the second material 226 set in the retention region 202. This allows an etchant which dissolves just the second material, to be used to create a multi-layer void in the already formed layers, which can function as a deposition region, without removing the any of the second material 226 shielded by the first material 224 in regions 202. As a result, the first material 224 acts as a shield or etch stop to allow selective etching of only a portion of the second material from which the layers are formed. Of course in other embodiments the shield of material 224 may extend in a closed fashion around selected second material regions which are to be retention regions and such regions and complementary removal regions may take on more complex configurations.

The first material 224 and the portion of the second material 226 which is positioned within the retention regions 202 form retention structures or elements 203. As will be described hereafter, the retention elements will remain after the etching (or other removal) of the second material from the removal region.

The first material 224 and the second material 226 can be any of a variety of materials which may be electrodeposited or depositable in some other manner (e.g. including metals and alloys such as nickel, copper, silver, gold, nickel-phosphorous, nickel-cobalt, or the like). Similarly, the second material may take a variety of forms (e.g. copper, zinc, tin, or the like). In some embodiments of the invention, the first material 224 is or includes nickel and the second material 226 is or includes copper.

The structure 201(a) can be fabricated by any of a variety of processes, including electrochemical fabrication techniques such as those set forth in the '630 patent and used in the EFAB®™ process as referenced above.

In some embodiments, an electrochemical fabrication process for forming a multi-layer structure involves separate operations during the formation of each layer of the structure 201(a) including providing a surface for deposition, depositing one material on a desired area of the surface, depositing an additional material over the exposed deposition surface and the previously deposited material, and shaping the structure (e.g. planarizing the structure) to obtain a finalized layer. After completing formation of a layer, the operations may be repeated or other operations may be performed to form a next layer, and so on until a desired number of layers are formed (i.e. until the final portion of the retention regions are formed).

Figure 6D:
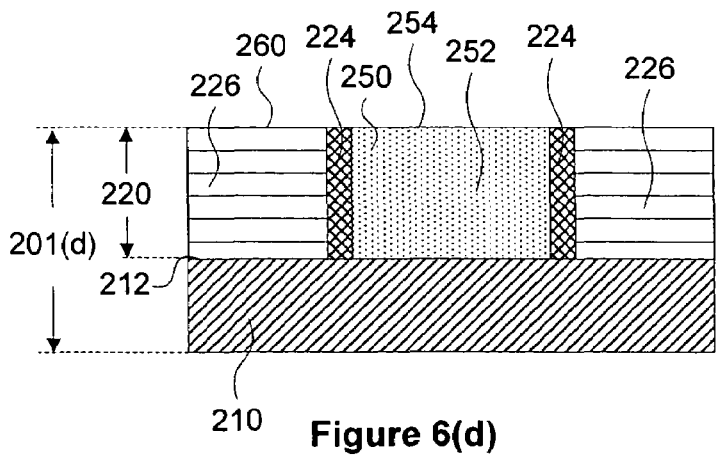
Figure 8F:
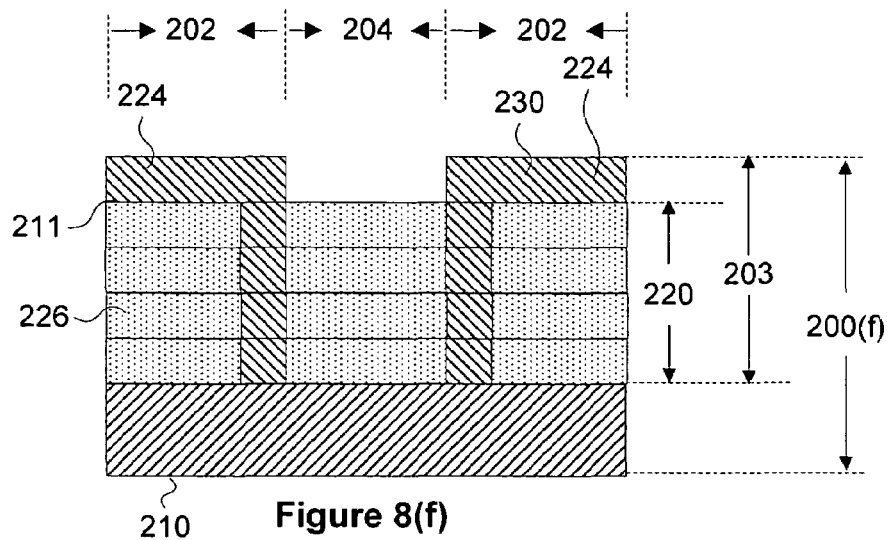
Figure 8G:
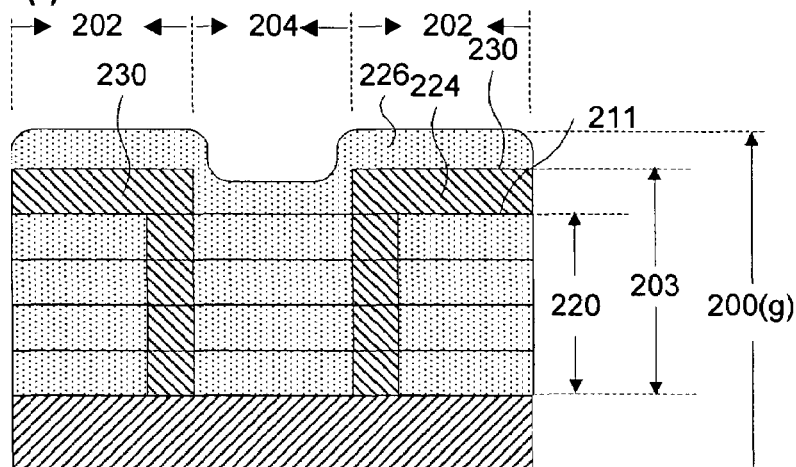
Figure 8H:
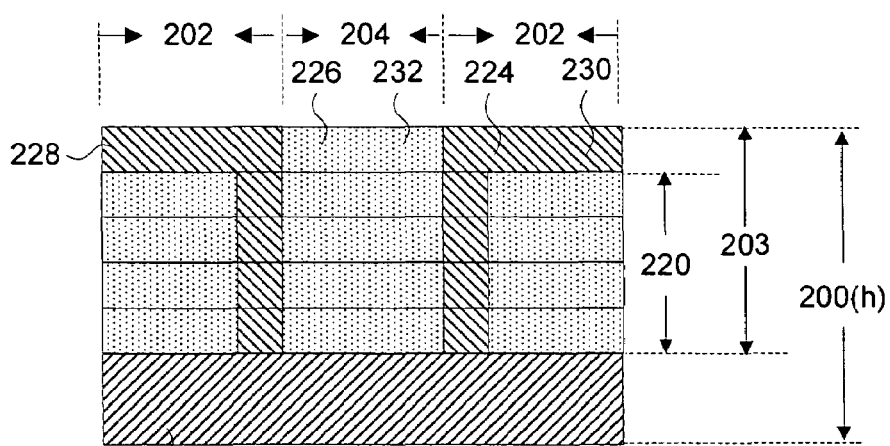

As noted above, in some embodiments, the first material positioned on the surface is selectively deposited upon one or more desired regions of a substrate using electrodeposition techniques. Then, after that deposition a second material is blanket deposited by electrodeposition so that the second material covers both the regions that were previously selectively deposited onto, and the regions of the substrate that did not receive any previously applied selective depositions. Next, planarizing techniques are applied to the materials deposited during the first and second operations to produce a smoothed surface of a first layer of desired thickness, having at least one region containing the first material and at least one region containing the second material. Then additional layers may be formed adjacent to the immediately preceding layer and adhered to the smoothed surface of that preceding layer. These additional layers are formed by repeating the prior operations wherein the formation of each subsequent layer treats the previously formed layers and the initial substrate as a new and thickening substrate. Once the formation of all layers has been completed, or according to some embodiments of the present invention, once a removal region is formed, at least one of the materials is generally removed by an etching process to expose or release the three-dimensional structure, or a desired portion thereof. After removing material to create a deposition region, the region may be back filled with a desired material (e.g. 250 shown in FIG. 6(c)), and then if desired, layer formation may continue. Prior to continuing layer formation, a planarization operation may be used to bring the state of the structure back to a desired point for continued building (e.g. as depicted in FIG. 6(d)). The continued building may or may not form additional removal regions, it may or may not cap off selected regions with a selected material, such as filled deposition regions (e.g. as seen in FIG. 6(e)). Once formation of the structure is complete, removal of remaining regions of second material (i.e. sacrificial material) that are unshielded may occur (e.g. as shown in FIG. 6(f)), and even remaining regions of shielding material may be removed in favor of retaining only the desired material or materials (e.g. as shown in FIG. 6(g)) that were made to fill the deposition region or regions.

A second embodiment of a method to provide a layered structure having defined retention and removal regions is set forth in process 110 as shown in FIG. 7. Method 110 includes (1) providing an initial deposition surface, block 112; (2) depositing a first material to define a retention region and a removal region, block 114; (3) depositing a second material to achieve a continuous layer of material, block 116; (4) shaping the deposited layer, e.g. planarizing it, block 118; (5) determining whether sufficient layers have been deposited to define the retention and removal regions, block 120; (6) depositing a first material to complete the shielding of the retention region from the removal region, block 122; (7) depositing a second material to achieve a continuous capping layer, block 124; and (8) shaping the capping layer 126.

FIGS. 8(a)-(h) set forth an example of structure formable according to the method 110 of FIG. 7. As similarly noted with regard to FIGS. 6(a)-6(g), though the example structure shown in FIGS. 8(a)-(f) shows a vertical removal region 204 of substantially uniform width, many other configurations for the removal region 204 and retention regions 202 are possible using the processes set forth herein.

FIG. 8(a) shows a substrate 210 which includes a surface 212 which may function as the initial deposition surface according to operation 112 of FIG. 7. Substrate 210 may be considered the initial portion 200(a) of a layered structure 200 that will be formed.

In general, the deposition surface 212 can be located on any of several different types of structures including, a substrate (as shown in FIG. 8(a)), a substrate with layers of material already formed thereon (e.g. layers of material including structural and sacrificial materials). In other words, the deposition surface is not just limited to the surface of a bare substrate. The element on which the deposition surface 212 is located, may be of any of a variety of suitable materials formable to have a surface smooth enough to allow for deposition of a layer of one or more materials. Such suitable materials include silicon, glass, plastic, metal (nickel, copper, silver, gold etc.). If the chosen material is non-conductive, it may be made conductive for example by application of a seed layer and possibly an adhesion layer or alternatively it may be used in its non-conductive form to receive an electroless deposition (after an appropriate surface treatment is formed) or to receive a blanker or selective deposition of a material by thermal spray techniques or the like. The surface provided can be formed to a desired shape by any of a variety of methods well known in the art including, for example etching (wet or dry), milling, lapping, molding, extrusion and the like.

In some embodiments, the operation of providing a surface can also include applying a seed layer on the element in order to facilitate later layer deposition. For instance, if the material of the element used is not sufficiently conductive (e.g. plastic or glass) to allow electrodeposition techniques to be employed for layer deposition, then a seed layer of conductive material may be used. Techniques for apply seed layers are described in various patents and patent applications incorporated herein by reference.

A first operation in providing a layered structure having defined retention and removal regions on the substrate of process 110 is depositing a first material to define a first portion of a retention region and a removal region, as indicated by block 114 of FIG. 7. During this operation a portion of layer of a multi-layer structure is obtained (e.g. fabricated).

In certain embodiments, the definition of regions is achieved by use of two or more materials, where one material shields the retention region from the etching that removes the material forming the removal region. While particular structural configurations are set forth in the accompanying disclosure, it should be clear that the size, shape and arrangement of the structural elements and regions can vary.

An example structure 200(b) obtainable through operation of the deposition of block 114 is shown in FIG. 8(b). As shown, a first material 224 is deposited on the deposition surface 212 of the substrate 210. The positioning of the first material 224 defines in part what will in part be the removal region 204. That is, the first material 224 is positioned abutting the first layer of removal region 204. It should be noted that the first material can be deposited to a thickness greater than the desired thickness of the initial layer as any additional material can be removed during the removal operation 118 as detailed herein. The width of the first material structure 224 can vary, however in some embodiments the width is equal to the minimum feature size obtainable by the masking process used while in other embodiments the width may be set to be the larger of a minimum value and a value necessary to ensure overlap between first material 224 on the present layer and material 224 on a subsequent layer and/or on a previous layer.

A variety of processes can be used to carry out the deposition of the first material 224. In some embodiments, the deposition process generally includes, providing a pattern mask defining the deposition regions, depositing the first material, and removing the mask.

The providing of a mask can include the use of a variety of different processes using different type of masks and applications as noted above, for example, some suitable masking techniques include use of a preformed mask (e.g. a CC mask) and some include use of a mask adhered to the surface onto which deposition is to occur (i.e. an adhered mask).

For the deposition of the first material 224 onto the deposition surface 212, as shown in FIG. 8(b), or onto any previously deposited layers 220, as shown in FIGS. 8 (d)-(e), any of the above described masks and masking techniques can be employed.

After application of a mask the first material 224 is deposited onto the deposition surface 212, by any of a variety of deposition methods, including for example by electroplating, electrophoretic deposition, electroless deposition, spray metal deposition, ink jet dispensing, extrusion, mounding and spreading or spinning. Then the mask used for deposition the first material 224 is removed. As detailed above, the type of mask removal is dependent on the type of mask used. For preformed masks, the mask is removed by physically separating the mask from its position during deposition and away from the deposition surface. With adhered masks the removal is typically done with a solvent, although etching or planarization may be employed.

While the description of the deposition depositing the first material 224 calls for it to be deposited on surface 212, it is clear that repeated depositions may deposit material on previously formed layers which may result in further defining of the removal region 204.

Following the deposition of the first material 224 and mask removal, the second material 226 can be deposited according to block 116 of FIG. 7. This deposition may occur in a blanket or selective manner. The deposition of the second material allows formation of arbitrarily shaped additional layers and aids in the shaping and sizing (e.g. planarization ) of the layer by covering any exposed portions of the deposition surface such that a continuous material layer is formed.

An example of the state of the process after deposition of a second material for the first layer is shown in FIG. 8(c) which shows the partially formed structure 200(c). As can be seen, the first material 224 and the exposed portions of the deposition surface 212, have been covered by the second material 226. The second material is positioned in both the removal region 204 and the retention regions 202.

The second material 226 can be deposited by any of a variety of methods including use of a selective or blanket deposition operation. During a blanket deposition the second material 226 is deposited upon all exposed (conductive) areas of the entire structure 200(c). In some embodiments, even when blanket deposition operations are used some masking may be desirable to ensure no deposits are formed in regions intended to remain clear of material (e.g. on the sides or back of the substrate such masking may take the form of dielectric that either inhibits a deposition material from contacting a surface or in electrodeposition operations prevents an electric current from flowing to or from the surface that is to remain clear of deposits. The insulating structure may take, for example, a ring shape to match a cylinder shaped substrate.

The blanket deposition can be achieved by electroplating from an anode (not shown), composed of the second material 226, through an appropriate plating solution (not shown), and to the cathode, which here is the structure 200(b) (or at least the exposed surface thereof). It is clear that the repeat use of this operation on subsequent layers will result in depositions not occurring directly on structure 200(b), but indirectly on structure 200(b) as a result of the deposition adhering to previous formed layers of material.

The next operation in method 110 of FIG. 7 is the shaping operation of block 118. During this operation, the layer is sized and shaped by removing the excess portions of the deposited first and second materials to achieve a layer of a desired thickness and surface. FIG. 8(d) provides and example of a result a planarization operation according to the shaping operation of block 118. Operation 118 results in a structure 200(d) which includes a planarized initial layer 222 positioned on the substrate 210. The layer 222 includes regions of first material 224 that bound the portion of the removal region 204 that exists on the first layer and sections of second material 226 positioned in both the retention regions 202 and removal region 204. The layer 222 also includes a deposition surface 223 onto which a subsequent layer will be added.

The process of sizing and shaping the deposited material to achieve the layer 222 can be achieved by any of a variety of methods including, for example, by milling, lapping, fly cutting, chemical mechanical polishing, and the like. During a lapping operation, for example, material is removed by moving a plate containing embedded abrasive over the surface of the structure 200(c) (shown in FIG. 8(c)), until a desired thickness of the layer 222 and smoothness of the surface 223 is achieved. In some embodiments, multi-stage lapping may occur using multiple successive removal operations using progressively decreasing sized particles and may eventually end with a polishing operation.

In addition to providing a deposition surface 223 on the initial layer 222, during repeated operations of the shaping operation 118, as may be performed in association with fabricating successive layers, the operation can provide deposition surfaces on each successive layer that is formed. Each deposition surface, in turn, may be considered the surface of a substrate onto which a next layer will be formed or onto which a capping layer 228 will be formed.

Next, process 110 moves forward to block 120 which inquires as to whether all necessary layers have been deposited to create desired retention and removal regions. During this inquiry a determination is made whether to deposit another intermediate layer in the fabrication of the desired structure, or to deposit a final capping layer to cover and shield the retention region. As each intermediate layer of the layered structure is deposited, the retention and removal regions are further defined (e.g. increased in height), layers are repeatedly deposited until only a capping layer is needed to be deposited to complete the definition of the regions.

As shown in FIG. 7, if the determination made during the process 120 is that sufficient layers have not been deposited, then the process moves loops back to block 114 so that another layer may be formed. If looping back occurs, layer forming operations 114,116 and 118 will be repeated until a sufficient number of intermediate layers have been deposited.

After formation of the last intermediate layer, the inquiry of block 120 produces a positive response and the process moves forward to block 122 which calls for deposition of a first material as part of forming a capping layer. The deposition of the first material, results in the formation of the remaining portion of a shield that protects completed retention regions 202. Next the process moves forward to block 124 which calls for deposition of a second material to complete deposition associated with the formation of a capping layer. This operations results in the formation of a continuous yet uncompleted capping layer 124. Next the process moves forward to block 126 which calls for the shaping (e.g. planarization) of the deposits to complete formation of the capping layer. Typically, the determination of whether sufficient layers have been deposited is based, at least in part, on the desired height of the non-layered structure which will be deposited in the cavity which will be formed when the material in the removal region is removed (as was described in detail herein in the material removal operation 130 and deposition operation 140 of the method 100).

FIG. 8(*e*) depicts an example structure 200(*e*) that has been formed after the repeated deposition of intermediate layers 220, such that sufficient layers have been deposited to define the retention and removal regions.

FIG. 8(*f*) depicts and example structure 200(*f*) resulting from the performance of the deposition of block 122. As can be seen, the structure 200(*f*) includes capping sections 230 formed of the first material which extend outward from and abutting the removal region 204 and over the respective portions of the second material 226 located in the retention regions 202. As a result, the first material 224 extends continuously up from the substrate 210, around the retention regions 202 to shield them from the later removal of material from the removal region 204. In the example shown, no shielding material is shown on the edges of the build regions as it is assumed that the edges will be shield from etching by external shielding elements, such as sleeves, or by other means while removal o the material from region 204 occurs. Retention region 202 includes a portion occupied by the first material 224 (forming horizontal barriers on each of the intermediate layers and the vertical etching barriers 230 form on the last layer) and a portion occupied by the second material 226. In other embodiments, other structure geometries can lead to vertical etching barriers located on intermediate layers. The deposition of the first material 224 onto the deposition surface 211, to form capping sections 230, may occur using any of the above masks and masking techniques described herein.

As shown in FIG. 8(*g*), after the deposition of the first material capping section 230, the second material 226 can be deposited (per block 224 of FIG. 7) to yield partially formed structure 200(*g*) as part of the process of completing formation of the capping layer and as part of the process of building up the desired structure. As can be seen in FIG. 8(*g*), the first material structures 230 of the capping layer and the exposed portions of the deposition surface 211, have been covered by the second material 226. The second material is positioned in both the removal region 204 and the retention regions 202. The deposition of the second material may ease the ability to shape and size the capping layer. For example when lapping is used to planarize a layer, the presence of second material may help avoid damage being caused to the first material of the capping layer.

FIG. 8(*h*) show the state of the process 110 after the shaping operation 126 of FIG. 7 has been performed on structure 200(*g*) of FIG. 8(*g*). Operation 126 sizes and shapes the capping layer by removing the excess portions of deposited first and second materials to achieve a layer of a desired thickness and surface finish. The process of sizing and shaping the deposited material to achieve the layer 228 can be achieved by any of a variety of material removal methods that have been discussed herein elsewhere.

Removing Material From the Removal Region(s) to Form a Deposition Region:

Returning to the operations of the fabrication method 100 of FIG. 5, after operation 110 the process moves forward to operation 130 which calls for the formation of a deposition region. During this operation, the material that formed the removal region of the layered structure, provided in operation 110, is removed to define a cavity or deposition region 240, as exemplified in FIG. 6(*b*). The removal of the material within the removal region may occur in any of a variety of ways, including using an etching process. Useable etching processes include applying a chemical etchant which is sufficiently reactive with the second material 226 (a sacrificial material) to dissolve it but is also non-reactive with the first material 224, or at least limited in its reaction to the first material 224, to prevent, or properly limit, etching of the first material.

Depositing a Non-Layered Material into the Deposition Region:

After the removal operation 140, the process 100 of FIG. 5, moves forward to block 140 which calls for the deposition of a non-layered material into the deposition region to form a composite structure. In other words, the deposition operation forms a structure or element of desired configuration from a desired material that has a height equivalent to a plurality of layer thicknesses. In so doing, an element can be fabricated, which by being a solid structure and not a series of electrodeposited layers, may provide improved characteristics. One such characteristic is an increased shear strength which, among other things, will allow application of greater lateral loads without damaging or destroying the structure. As described in detail herein, increasing the shear strength allows for improved interlaced elements (e.g. improved anchoring between layers). Another improved characteristic is eliminating the potential for delamination (e.g. layer separation) of the structure. In other embodiments, for example, an improved characteristic may involve the ability to form an element out of a specific material of a desired height which would not have been possible if layer-by-layer build up were required.

An example of a multi-layer thickness element may be seen in any of FIGS. 6(*c*)-6(*g*). FIG. 6(*c*) illustrates the result of a blanket deposition of element material 250. As shown, a structure 201(*c*) includes the substrate 210, the retention elements 203 and, a core element formed from material 250. The core element material 250 is positioned on the deposition surface 212 between and over the retention elements 203. The depth of the deposition can vary, including, to a depth where the material 250 extends past the retention elements 203 (as shown), substantially at the depth of the retention elements 203, or even below the depth of the retention elements 203. The specific depth of the core element material 250 can vary since in later operations of the method 100, the material 250 may be planarized to a desired depth.

The core element material 250 can be a separate third material (e.g. not the first material 224, or the second material 226), the first material 224, or the second material 226. More specifically, the material 250 may be any of a variety of materials including, for example, permalloy, nickel, copper, gold, silver, and the like.

The process of deposition for material 250 can be a blanket electrochemical deposition or any other suitable deposition method such as spinning the material on, sputtering, and chemical vapor deposition. During a blanket deposition (e.g. non-selective) the material 250 is deposited upon all exposed (conductive) areas of the entire structure 201(*c*). While the deposition of the element 250 is shown in FIG. 6(*c*) as a blanket deposition, it should be clear that other types of deposition techniques including any of a variety of types of selective deposition can be used.

Shaping the Composite Structure:

After the deposition of operation 140 of FIG. 5, the process may move forward to operation 150 which calls for the shaping of the composite structure by removing excess material from the structure to define a desired dimension (e.g. height) and surface of the structure.

An example of the result of the shaping operation 150 is shown in FIG. 6(d). As can be seen, the structure 201(c) of FIG. 6(c) has been converted to structure 201(d) by planarizing away material so as to smooth the deposited material 250 and to remove the capping layer 228 (etch stop). As illustrated in FIG. 6(d), after operation of the process 150, a core element 252 having a core surface 254 and a planarized surface 260 of the structure 201(d) are defined. The core element 252 is positioned on the deposition surface 212 and between the structures of the first material 224 and the second material 226. The core element 252 is a solid non-layered structure.

By removing the capping layer 228 during this process the sections of the second material 226 sounding the core element 252 have been exposed and are no longer shielded (from etching, etc.) by the first material capping sections 230 (not shown). This allows the structures of the second material 226 to be removed in later procedures.

The shaping process 150 can be performed by a variety of removal methods which have been discussed elsewhere herein.

If at the completion of the planarization of the structure 201(d), the core material 250 is not sufficiently conductive to continue the building process by electro-deposition, and continued build up by electrodeposition is desired, a conductive seed layer may be applied over the structure 201(d). The seed layer (not shown) can be applied across the planarized surface 260 such that the layer spans the surface 254 of the core element 252 and extends to make contact with the conductive first material 224 and/or second material 226. The seed layer can be of any of a variety of materials including, nickel, copper, silver, gold and the like, and may be made to overlay an adhesion layer formed from a thin deposition of, for example, titanium or chromium. The seed layer can be deposited by any suitable known deposition method.

It should be noted that in some embodiments of the invention, the fabrication process ends with the sizing and shaping process 150 so as to provide a composite structure including the element and materials 124 and 126 (such as that shown in structure 201(d)). However in other embodiments, method 100 may include additional operations, such as, for example, (1) removing any remaining material 226 before or after capping material 250 with a shield (e.g. of material 224), and/or (2) removing shield material 224 that surrounds material 250.

Encasing the Non-layered Material:

Returning to FIG. 5, after operation 150, the process may move forward to block 160 which calls for encasing the non-layered material 150. The encasing operation may be desirable so as to protect the non-layered core element material 150 from later operations, including etching and deposition operations.

An example of an encased core element is shown in FIG. 6(e). The structure 201(e) has a capping layer 270 deposited over it. The capping layer 270 includes portions of first material 224 and second material 226. The first material portion 272 is made of first material 224 and is positioned over the core element surface 254 and the first material 224 structures. This results in the core element 252 being surrounded or encased by first material 224 (except of course where the core element contacts the substrate surface 212). The second material portion 274 is made of the second material 224, which is positioned about the first material portion and over the portions of second material 226 of the intermediate layers 220. This embodiment allows the portions of second material to be etched away without damage to the core element 252 which is protected by the first material.

The deposition operations and any desired planarization operations may be used in encasing the element. Such operations may be similar to or different from those discussed herein elsewhere with regard to forming intermediate layers or capping layers.

In some alternative embodiments, after the deposition of a first material portion 272, the fabrication can either continue with the deposition of the second material portion 274 and then to a shaping operation to form the capping layer 270 as shown or can proceed to the next operation of method 100 without the addition of the second material portion 274. If in some embodiments, the next process is the removal of sacrificial material (e.g. operation 170); then, since core element 252 has been enclosed by the deposition of the first material portion 272, the second layer portion 274 does not have to be deposited. But in embodiments where further depositions over the capping layer 270 are desired, then deposition of portion 274 may be preferable.

The second material portion 274 can be deposited by any of a variety of methods discussed herein before for depositing second material 226.

In some embodiments of the invention the fabrication process ends with the encasing process of block 160 of FIG. 5 so as to provide an encased structure such as that exemplified as structure 201(e) of FIG. 6(e). However, in other embodiments additional operations may be performed.

Removing Undesired Material:

After operation 160, the process of FIG. 5 may move forward to block 170 which calls for the removal of undesired material. During such removal operations any material (e.g. sacrificial material) that is not desired to be included in the final structure (e.g. element formed from material 250) is removed. During this process some or all material which is positioned about the core element may be removed for example using one or more etching operations.

As exemplified in FIGS. 6(f) and 6(g), a first removing process may be used to remove only second material 226 (as shown in FIG. 6(f)), and a second etching operation may be used to remove first material 224 (as shown in FIG. 6(g)).

In the example of FIG. 6(f), structure 201(f) includes the core element 250 positioned on the surface 212 of substrate 210 and surrounded by the first material 224. In the example of FIG. 6(g), structure 201(g) includes the core element 250 positioned on the surface 212 of substrate 210.

During the removal process 160, the second material 226 and first material 224 removal operations may be performed in any of a variety of ways, including using an etching process. Useable etching processes include applying a chemical etchant which is sufficiently reactive with either the second material 226 and/or the first material 224 to dissolve them. However, to maintain first material 224 during the etch of the second material 226, the etchant used should be substantially non-reactive with the first material 224, or at least limited in its reaction to the first material 224 to prevent, or properly limit, etching of the first material 224.

Likewise, to maintain the core element material 250 during the etch of the first material 224, the etchant used should be substantially non-reactive with the core element material 250, or at least limited in its reaction to the core element material 250 to prevent, or properly limit, etching of the core element material 250. However, because the first material 224 is positioned to encase the core element 252, the etchant used to remove the second material 226 can be reactive to the core element material 252 without etching the core element material 252 so long as it is not also reactive with the first material 224.

Some Alternate Embodiments

Many alternative embodiments exist for the methods and apparatuses described above. Some of these embodiments include methods for forming a non-layered structure separated from a substrate, forming a completely encased non-layered structure, forming a structure of layered and non-layered components, forming a structure of non-layered components, and forming a structure with staggered or interlaced non-layered components.

An alternate embodiment of the current method provides a method for forming a non-layered structure separated from a substrate 101. This embodiment employs the same processes set forth in method 100 described above, but the providing process 110 provides a layered structure which is configured so the non-layered structure obtained from the fabrication method is separated from the substrate and not attached to it.

Figure 9:
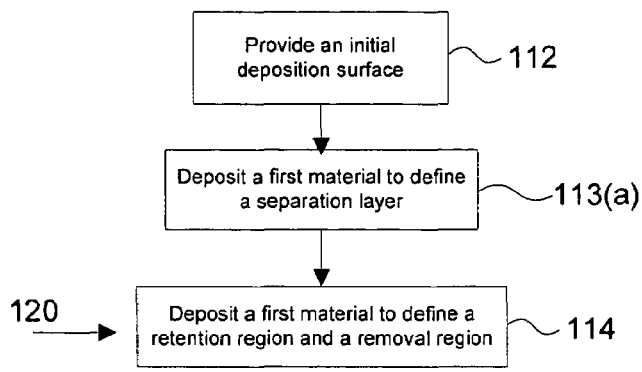
FIG. 9 is a flowchart of a method in accordance with at least one embodiment of the invention.

To achieve this, for example, process 110 may be modified to include an additional operation of depositing a first material to define a separation layer 113(a), as illustrated in FIG. 9. During the depositing operation 113(a) at least one layer of first material is deposited over the deposition surface of the substrate. Because this layer (or layers) will be positioned between the substrate and the non-layered structure, the layer will function effectively as a spacer to allow, in later operations of the modified method 110 for the non-layered structure to be separated from the substrate. In some embodiments, after the one or more deposition operations 113(a), shaping or planarization operations may be formed.

Figure 10A:
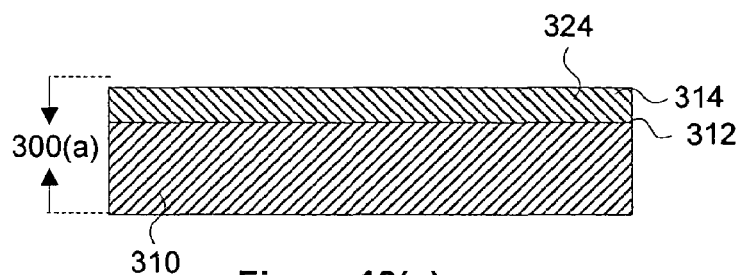
FIGS. 10(a)-(d) are side views showing a fabrication process in accordance with at least one embodiment of the invention.
Figure 10B:
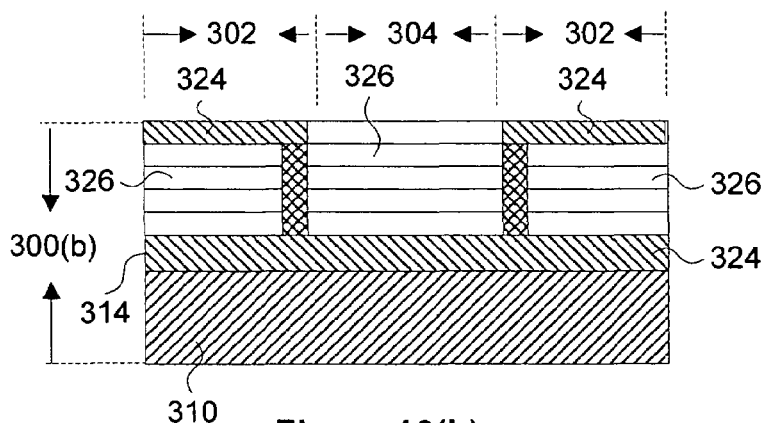
Figure 10C:
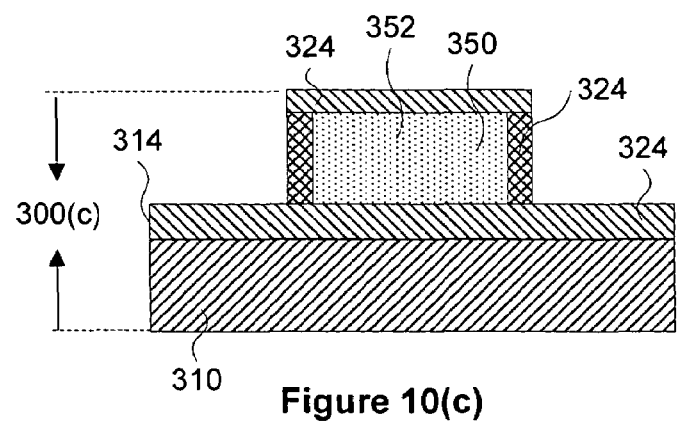
Figure 10D:
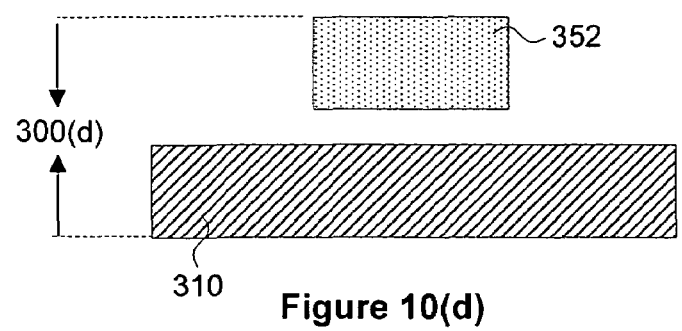

FIG. 10(a) depicts an example of a structure 300(a) obtained through operation 113(a). A separation layer 314 of first material 324 has been deposited over the substrate 310. FIG. 10(b) shows an example of a structure 300(b) having defined retention regions 302 and removal region 304 which can be produced by the operation of the process 110. The removal region 304 is positioned above the separation layer 314 for later separation of the non-layered structure (not shown) from the substrate 310. FIG. 10(c) shows an example of a structure 300(c) which is obtained by method 100 starting with the structure 300(b) (shown in FIG. 10(b)), with the process of removing any undesired material 170 having only removed the second material from the structure. Continuing the process, after performance of operation 170 and removing the remaining first material 324 as shown in FIG. 10(c) results in the structure 300(d) shown in FIG. 10(d). The structure 300(d) includes the core element 352 being separated from the substrate 310. Typically, a structure such as structure 300(d) would be attached the substrate or another section at other section of its structure to allow its positioning above the substrate as shown in FIG. 10(d).

Other embodiments of the invention include methods for forming completely encased non-layered structures. Various alternatives are possible and may include operations such as forming a completely encased non-layered structure attached to the substrate, forming a completely encased non-layered structure attached to the substrate with exposed substrate surfaces, and forming completely encased non-layered structure detached from the substrate.

The method of forming a completely encased non-layered structure attached to the substrate is the same as the method 110 set forth above except without removing of the first material 324 to release the core element 352 from the substrate 310 performed in the removal process 170. That is, the method can be achieved by performing method 101 up to process 170 and then during process 170 only removing the second material 326 and not continuing on to remove the first material 324. An example of a structure obtainable through the fabrication method is shown in FIG. 10(c). As shown, structure 300(c) has the core element 352 completely encased by first material 324.

For the method of forming a completely encased non-layered structure attached to the substrate with exposed substrate surfaces, the same processes set forth in method 100 described above are employed, but the providing process 110 provides a layered structure which is configured so the non-layered structure obtained from the fabrication method is completely encased and attached to the substrate.

Figure 11:
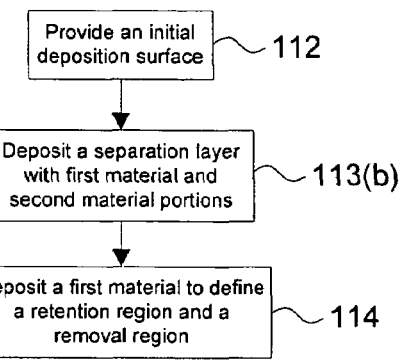
FIG. 11 is a flowchart of a method in accordance with at least one embodiment of the invention.

In this embodiment of the invention, the process 110 includes the additional operation of depositing a separation layer with first material and second material portions 113(b), as shown in FIG. 11. During the depositing operation 113(b) a layer having first material and second material sections is deposited over the deposition surface of the substrate. Because this layer will be positioned between the substrate and the non-layered structure, the layer will be a portion of the encasing structure around the non-layered structure, in later operations of the method, for the non-layered structure to be encased.

Figure 12A:
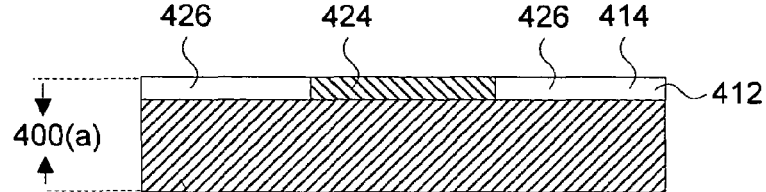
FIGS. 12(a)-(c) are side views showing a fabrication process in accordance with at least one embodiment of the invention.
Figure 12B:
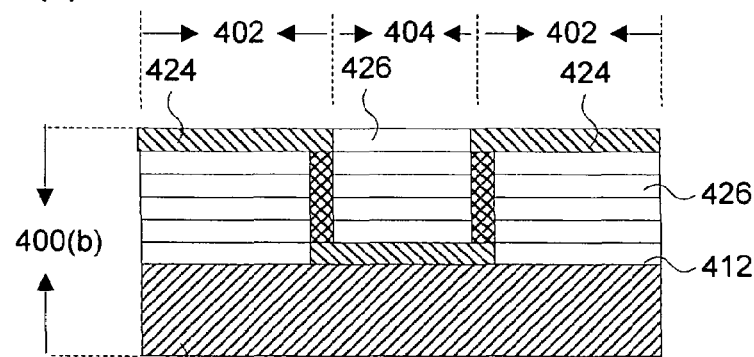
Figure 12C:
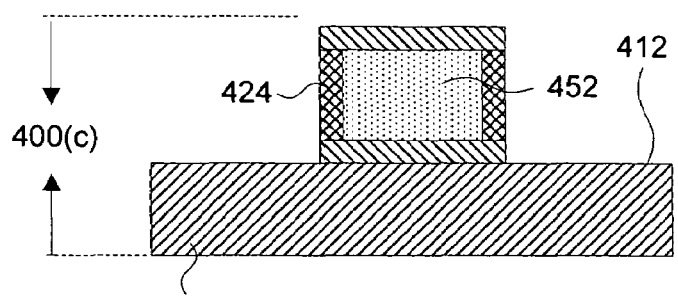

An example structure 300(a) obtainable through operation 113(b) is shown in FIG. 12(a). As can be seen, a base encasing layer 414 of first material 424 and second material 426 has been deposited over the substrate 410. FIG. 12(b) shows an example structure 400(b) having defined retention regions 402 and a removal region 404, which can be produced by the operation of the process 110. The removal region 404 is positioned above the base encasing layer 414. FIG. 12(c) shows an example structure 400(c) which is obtainable by the operation of the method 100 starting with the structure 400(b) (shown in FIG. 12(b)), with the process of removing any undesired material 170 having only removed the second material 426 (not shown) from the structure. The structure 400(c) includes the core element 452 being completely encased by the first material 424.

Another alternate embodiment of the current method is a method for forming completely encased non-layered structure detached from the substrate. This embodiment employs the same processes set forth in method 100 described above, but the providing process 110 provides a layered structure which is configured so the non-layered structure obtained from the fabrication method 101 is encased and separated from the substrate.

Figure 13:
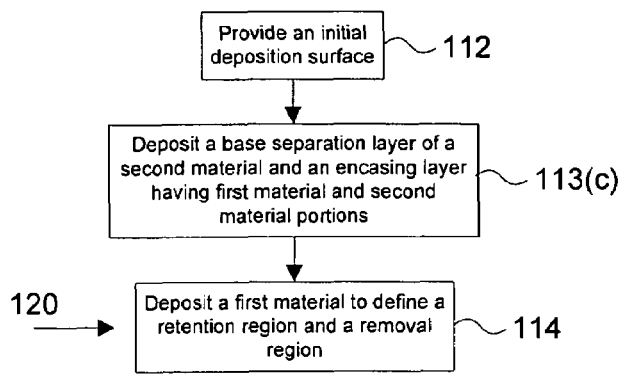
FIG. 13 is a flowchart of a method in accordance with at least one embodiment of the invention.

In this embodiment of the invention, the process 110 includes the addition of the operation of depositing a base separation layer of a second material and an encasing layer having first material and second material portions 113(c), as shown in FIG. 13. During the depositing operation 113(c) at least one separation layer of second material is deposited over the deposition surface of the substrate. Because this layer (or layers) will be positioned between the substrate and the encasing structure around the non-layered structure, the separation layer will function to allow, in later operations of the method, for the encased non-layered structure to be separated from the substrate.

Figure 14A:
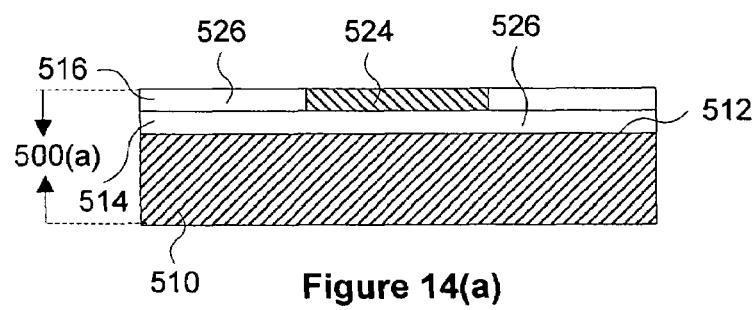
FIGS. 14(a)-(c) are side views showing a fabrication process in accordance with at least one embodiment of the invention.
Figure 14B:
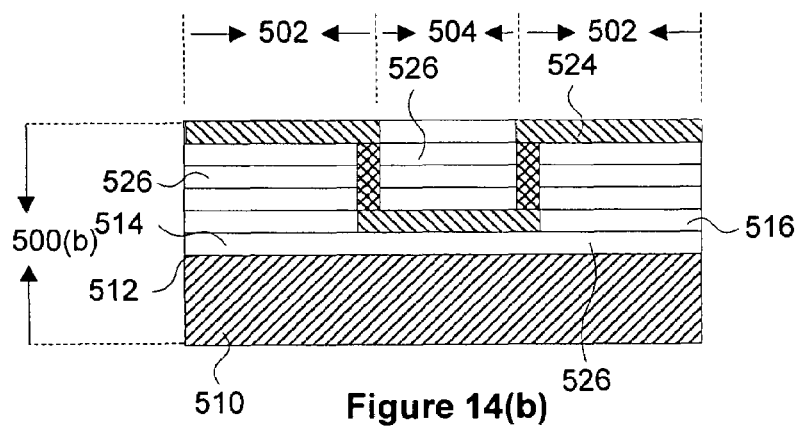
Figure 14C:
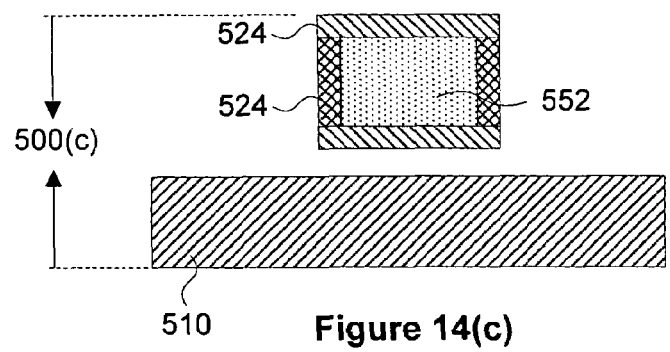

An example structure 500(a) obtainable through operation 113(c) is shown in FIG. 14(a). As can be seen, a separation layer 514 of second material 526 has been deposited over the substrate 510 and encasing layer 516 of first material 524 and second material 526 has been deposited over the separation layer 514. FIG. 14(b) shows an example structure 500(b) having defined retention regions 502 and removal region 504 which can be produced by the operation of the process 110. The removal region 504 is positioned above the encasing layer. FIG. 14(c) shows an example structure 500(c) which is obtainable by method 100 starting with the structure 500(b) (shown in FIG. 14(b)), with the process of removing any undesired material 170 having only removed the second material from the structure. The structure 500(c) includes the core element 552 being encased by first material 524 and separated from the substrate 510. Typically, a structure such as structure 500(c) would be attached the substrate or another element at other section of its structure to allow its positioning above the substrate as shown in FIG. 14(c).

Figure 15:
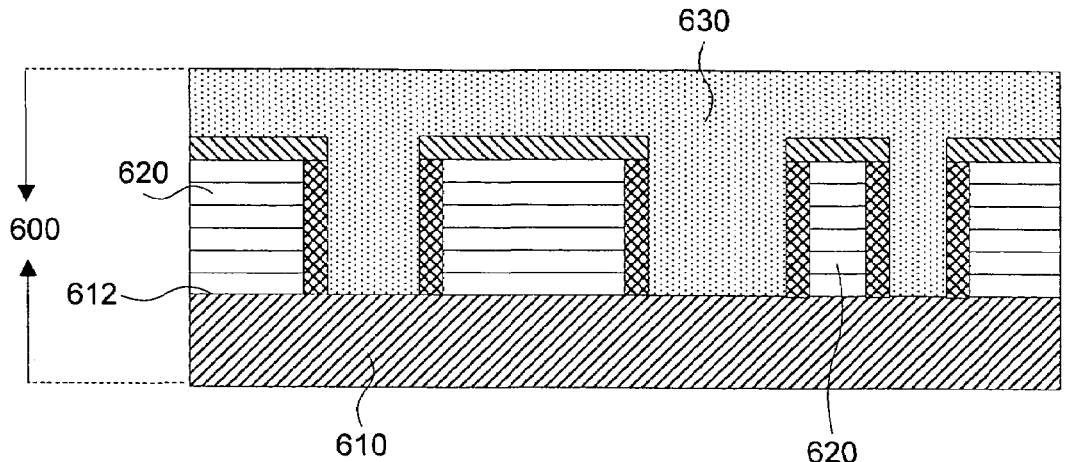
FIG. 15 is a side view showing a structure in accordance with at least one embodiment of the invention.

The fabrication method 100 of the invention can also be employed to form a structure of layered and non-layered components. An example of such a structure is shown in FIG. 6(d) wherein the structure 201(d) includes both layered and non-layered components. It can clearly by seen that by altering of the arrangement of the retention and removal regions of layered structure provides in process 110 of method 100, different embodiments of the structure 201(d) with varying configurations of layered and non-layered elements can be obtained. Further, adjusting how structure is sized and shaped in the process 150, alternating and interlaced composite structures can be created. One example structure with interlaced layered and non-layered elements which can be obtained through operation of the method 100 through the sizing and shaping process 150 is shown in FIG. 15. As shown, the structure 600 includes a substrate 610 with a surface 612, layered elements 620 and a non-layered element 630.

Other embodiments of the invention include methods for forming a structure of non-layered components and forming a structure with staggered or interlaced non-layered components.

Figure 16:
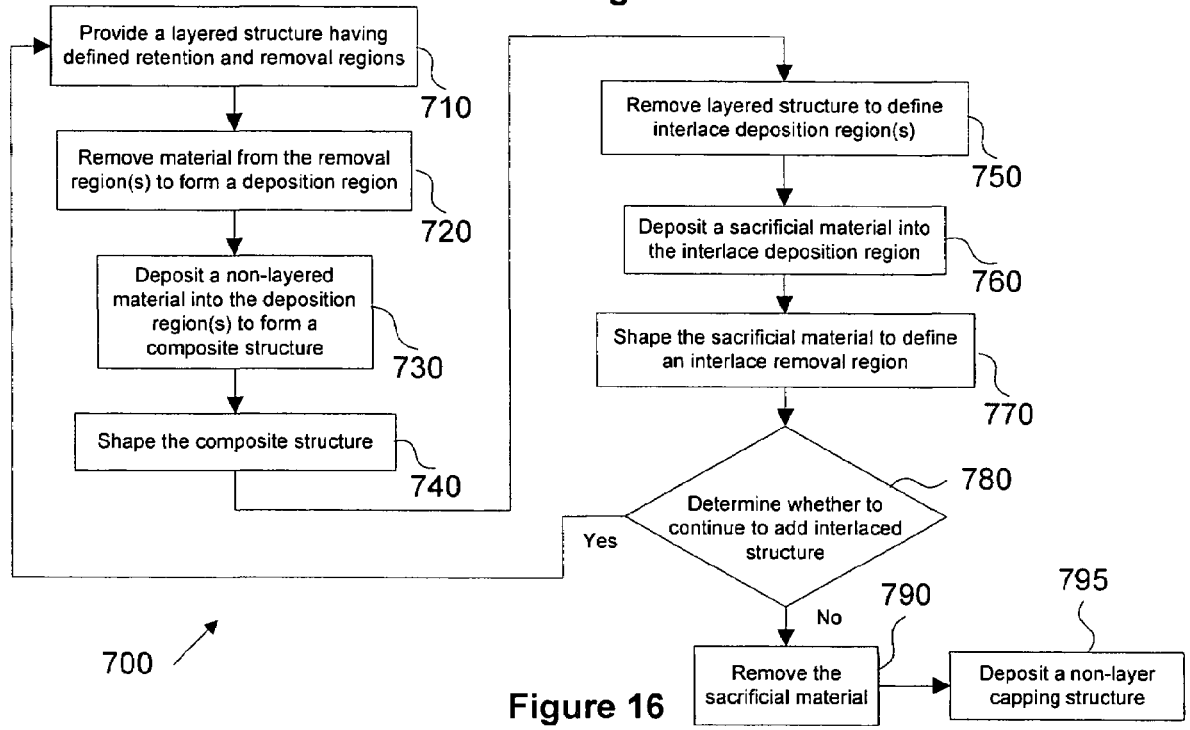
FIG. 16 is a flowchart of a method in accordance with at least one embodiment of the invention.

Another One-embodiment of the invention provides a method for fabricating interlaced elements 700 as- shown in FIG. 16. The method 700 includes the processes of providing a layered structure having defined retention and removal regions 710, removing material from the removal regions to form a deposition region 720, depositing a non-layered material into the deposition region(s) to form a composite structure 730, shaping the composite structure 740, removing layered structure to define interlace deposition region(s) 750, depositing a sacrificial material to define an interface removal region 760, shaping the sacrificial material to define an interlace removal region 770, determining whether to continue to add interlaced structure 780, removing the sacrificial material 790, and depositing a non-layered capping structure 795. Examples of structures which can be obtained by operation of these processes are shown in FIGS. 17(a)-(j). The specific operations (e.g. removing, depositing, etc.) of method 700 can be performed by any of the processes of the relevant method detailed herein (including fabrication method 100 and providing process 110) and as described in any of the references incorporated herein.

Figure 17A:
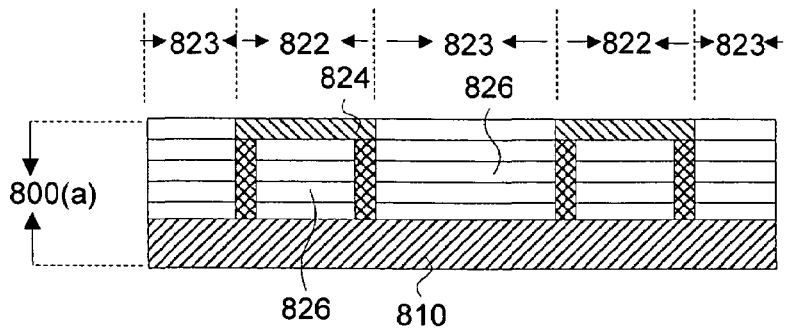
FIGS. 17(a)-(j) are side views showing a fabrication process in accordance with at least one embodiment of the invention.

The portion of method 700 which provides a layered structure having defined retention and removal regions 710, as shown in FIG. 16 is functionally the same as that detailed above in the providing a layered structure 110 of the fabrication method 100. That is, this process provides a layered structure (typically positioned over a substrate) that has defined regions which are to be removed and regions which will be retained during a following removal process. An example structure which can be provided by this process is shown in FIG. 17(a). As shown, the structure 800(a) includes a substrate 810, a layered structure 820 having a retention regions 822 and a removal regions 823. The retention regions include a first material 824 which functions as a shield during the later removal process and second material 826 encased by the first material 824. The removal regions include second material 826.

Figure 17B:
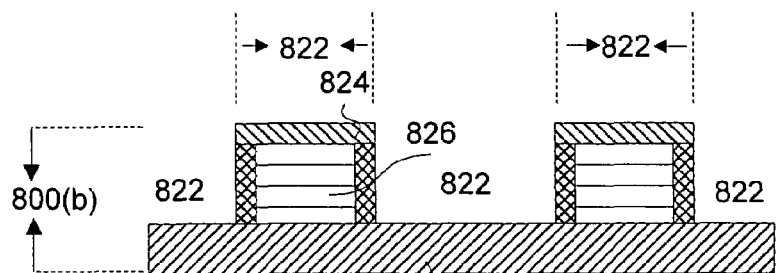

Step or block 720 in the method 700 which calls for removing material from the removal regions to form a deposition region 720 is functionally the same as that detailed above in the removing step or block 130 of the fabrication method 100. That is, operation of the step 720 removes the layered structure in the defined removal region(s). An example structure which can be provided by this process is shown in FIG. 17(b). As shown, the structure 800(b) includes a substrate 810, layered structures of the retention regions 822 which includes the first material 824 and the second material 826, and defined deposition regions 840.

Figure 17C:
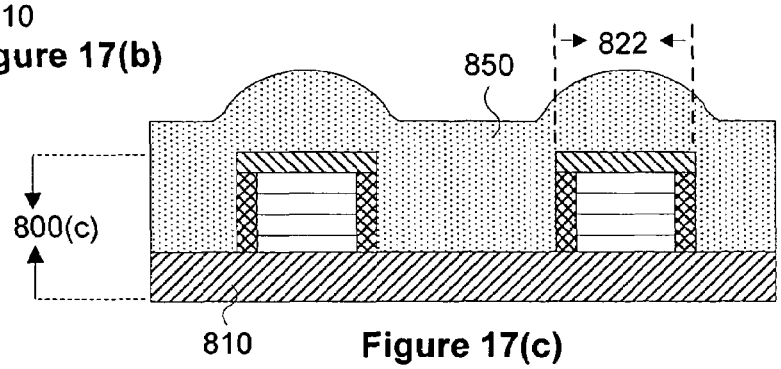

Step or block 730 of fabrication method 700 which calls for depositing a non-layered material into the deposition region(s) to form a composite structure is functionally the same as that detailed above in the depositing a non-layered material, step or block 140, of the fabrication method 100. That is, step 730 blanket deposits non-layered material over the structure to fill the deposition regions. An example of a structure which can be achieved by this process is shown in FIG. 17(c). As shown, the structure 800(c) includes a substrate 810, layered structures of the retention regions 822 and non-layer material 850 deposited over the substrate 810 and the structures of the retention regions 822.

Figure 17D:
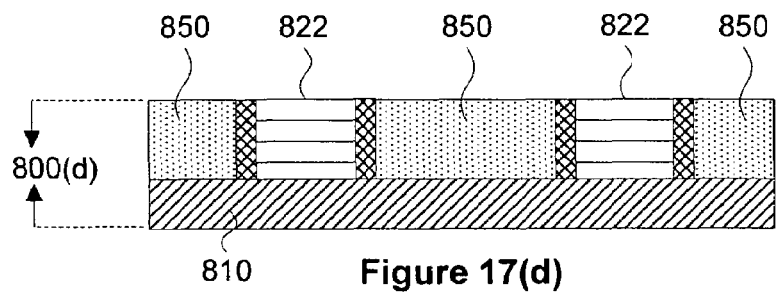

Step or block 740 in the method 700 which calls for shaping the composite structure 740, as show in FIG. 16. This process is functionally the same as that detailed above in the shaping process 150 of the fabrication method 100. That is, the shaping step 740 is, for example, a planarization (by lapping, etc.) operation or step which shapes the structure and provides a surface for later deposition. An example of a structure which can be achieved by this process is shown in FIG. 17(d). As shown, the structure 800(d) includes a substrate 810, layered structures of the retention regions 822 and non-layer material 850. Wherein the layered structures of the retention regions 822 and non-layer material 850 have been planarized to a uniform surface.

Figure 17E:
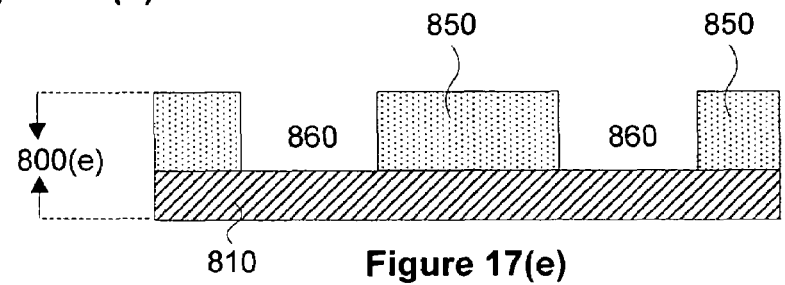

The step of block 750 of method 700 calls for removing layered structure to define interlace deposition region(s) 750. This step functions to clear the remaining layered deposits to form interlace deposition regions which will allow later deposition of a non-layered material in a manner that forms an interlaced structure. This process can be performed by any of the removal methods set forth herein or in the incorporated references, including by etching the first and second materials which are positioned in the retention regions 822. Shown in FIG. 17(e) is an example structure which can be obtained by operation of the removal process 750. As shown, the structure 800(e) includes a substrate 810, structures of non-layered material 850 and interlaced deposition regions 860.

Figure 17F:
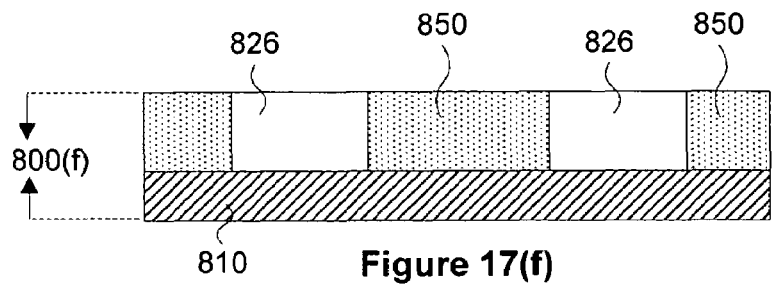

Step or block 760 of the fabrication method 700 calls for depositing a sacrificial material which will define an interface removal region (possibly after further operation). This operation or step functions to temporarily place a sacrificial material in the interlace deposition regions to allow the later deposition of a layered structure thereupon. This operation or step can be performed by any of the deposition methods (e.g. a blanket deposition of the second material) set forth herein or in the incorporated references. FIG. 17(f) illustrates an example of a structure which can be obtained by operation of step or block 760. As shown, the structure 800(f) includes a substrate 810, structures of non-layered material 850 and sacrificial material 826 deposited in the interlace deposition regions. It should be noted that as the material 826 is shown planarized the structure of FIG. 17(f) has also undergone the operation or step 770 of shaping the sacrificial material to define an interlace removal region, as described further below.

Step or block 770 functions to planarize the surface of the structure to allow the deposition of a layered structure thereupon. This process can be performed by any of the shaping methods (e.g. planarization by lapping) set forth herein or in the incorporated references. FIG. 17(f). as noted above, illustrates an example structure which can be obtained by operation of step or block 770. As shown, the structure 800(f) includes a substrate 810, structures of non-layered material 850 and sacrificial material 826 planarized to form a deposition surface.

Figure 17G:
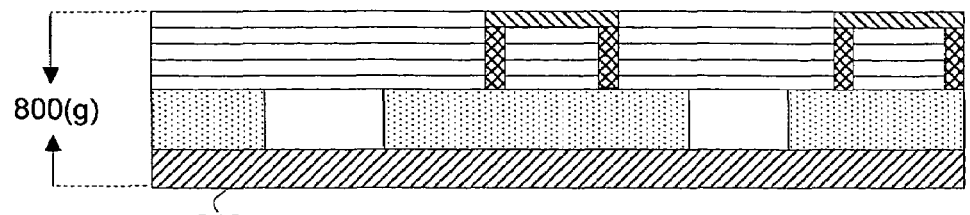
Figure 17H:
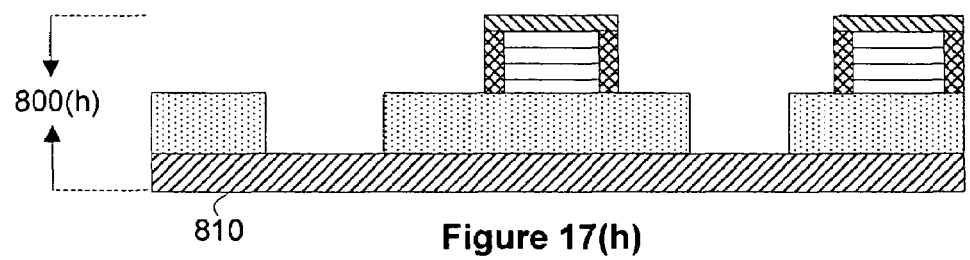
Figure 17I:
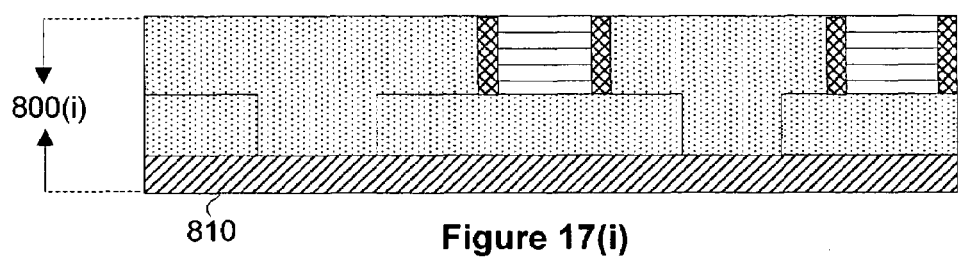

The fabrication method 700 further includes block or step 780 which calls for determining whether to continue to add additional interlaced structure. This block or step process functions to allow either a repeating of the prior operations or steps of prior blocks 710-770, described above to continue to build interlaced elements or to finish the fabrication by adding a capping structure (processes 790 and 795, described herein). FIGS. 17(g) through 17(i) show example structures obtainable by determining to continue to add interlaced structures according to the inquiry of step or block 780 which result from repetition of the operations or steps 710. In the example of FIGS. 17(h) and 17(i), block 720 is repeated to yield structure 800(h), blocks 730 and 740 are repeated to create structure 800(i) which include elements of non-layered material that interlace with elements of previously deposited non-layer material. Repeating blocks 750, 760 and 770 would result in the removal of the layered materials from the second retention regions, i.e. the retention regions remaining in FIG. 17(i), and filling of the created voids with sacrificial material and the shaping of the deposited sacrificial material (not shown).

Upon determining (in block 780) not to add additional interlaced structure the process moves forward to block 790 which calls for removing the sacrificial material. Block 780 is functionally the same as that detailed with regard to blocks 720 of method 700 and block 130 of the fabrication method 100. That is, operation of the process 780 removes the deposited (blanket) sacrificial material set in the interlace deposition regions by operations of blocks 760 and 770. This removes the sacrificial material and prepares the structure for deposition of a final interlaced capping material or structure.

Figure 17J:
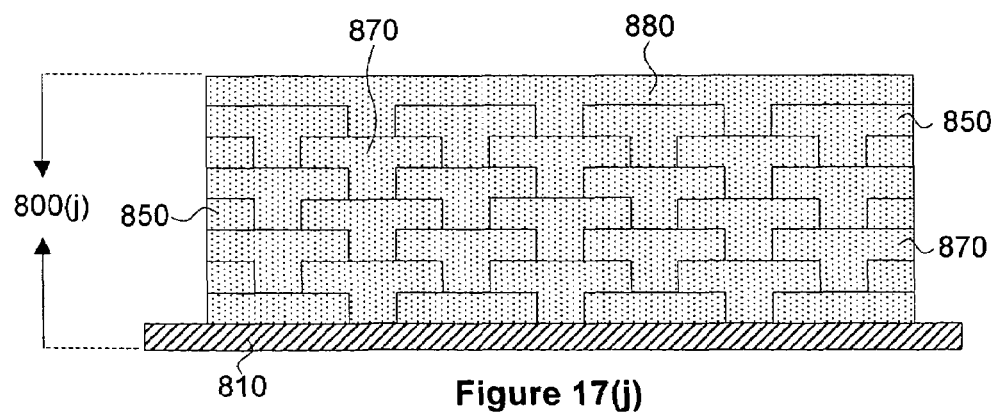

Step or block 795 calls for depositing a non-layered capping structure. This process is functionally the same as that detailed above in block 730 of method 700 and block 140 of the fabrication method 100. That is, the deposition process 795 blanket deposits non-layered material over the structure to fill the deposition regions and form a capping structure. This process can also include shaping the deposited material to size the structure and achieve a desired surface thereupon. An example structure which can be achieved by operation of the deposition process 795 is shown in FIG. 17(j). As shown, the structure 800(j) includes a substrate 810, non-layer material 850, interlaced non-layered structures 870 and a non-layered capping structure 880.

Figure 18:
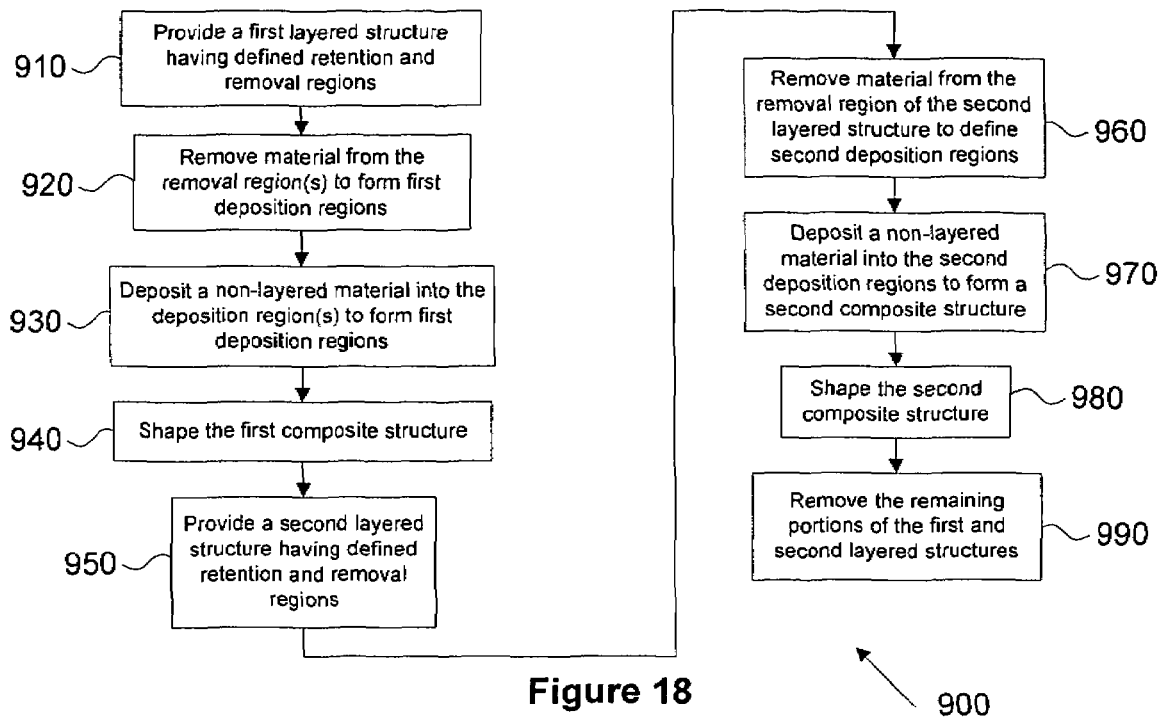
FIG. 18 is a flowchart of a method in accordance with at least one embodiment of the invention.

Another embodiment of the invention is a method for fabricating extended interlaced elements 900 as shown in FIG. 18. The method 900 includes providing a first layered structure having defined retention and removal regions 910, removing material from the removal region(s) to form first deposition regions 920, depositing a non-layered material into the deposition region(s) to form a first composite structure 930, shaping the first composite structure 940, providing a second layered structure having defined retention and removal regions 950, removing material from the removal region of the second layered structure to define second deposition regions 960, depositing a non-layered material into the second deposition regions to form a second composite structure 970, shaping the second composite structure 980, and removing the remaining portions of the first and second layered structures 990. Examples structures which can be obtained by operation of the processes of the method 900 are shown in FIGS. 19(a) through 19(f).

As can be seen, the method 900 allows fabrication of interlacing elements that interlace (e.g. extend past) one or more levels of elements. The specific operations (e.g. removing, depositing, etc.) of the processes of method 900 can be performed by any of the relevant method detailed herein (including fabrication method 100, fabrication method 700 and providing process 110) and as described in any of the references incorporated herein.

Figure 19A:
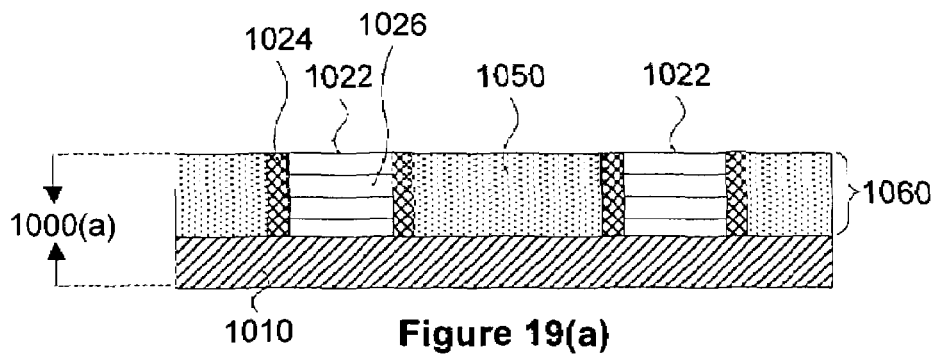
FIGS. 19(a)-(f) are side views showing a fabrication process in accordance with at least one embodiment of the invention.

FIG. 19(a) shows an example structure 1000(a) which can be obtained through the performance of processes of the method 900, including providing a first layered structure 910, removing material 920, depositing a non-layered material 930 and shaping the structure 940. As shown, the structure 1000(a) includes a substrate 1010, retention regions structures 1022 having first material 1024 and second material 1026 portions, first non-layered elements 1050, a first composite structure or level 1060.

Figure 19B:
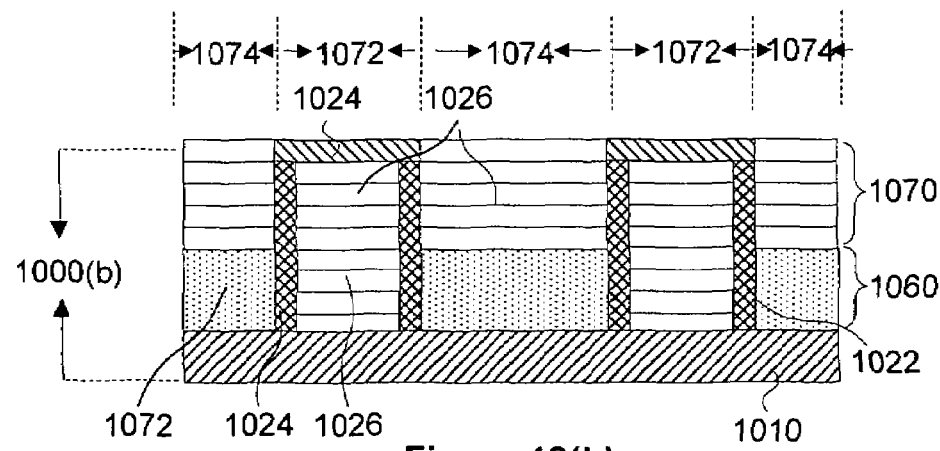

FIG. 19(b) shows an example structure 1000(b) which can be obtained through the performance of process of providing a second layered structure having defined retention and removal regions 950. As shown, the structure 1000(b) includes, a second layered structure 1070 positioned over the first composite structure 1060. The second layered structure 1070 includes first material 1024 and second material 1026 and is divided into retention regions 1072 and removal regions 1074. As can be seen, the retention portion 1072 of the second layered structure 1070 is positioned directly over the retention structures 1022. Also, the first material 1024 of the second layered structure 1070 is positioned directly over the first material of the first composite structure 1060. As is detailed herein, this positioning allows for the later creation of a void that spans two levels of non-layered elements. This void can then be used to create an interlacing element that interlaces with two levels of elements. This is in contrast to the single level of interlacing obtainable by the fabrication method 700, detailed above, where the retention structures are staggered and aligned in each level.

Figure 19C:
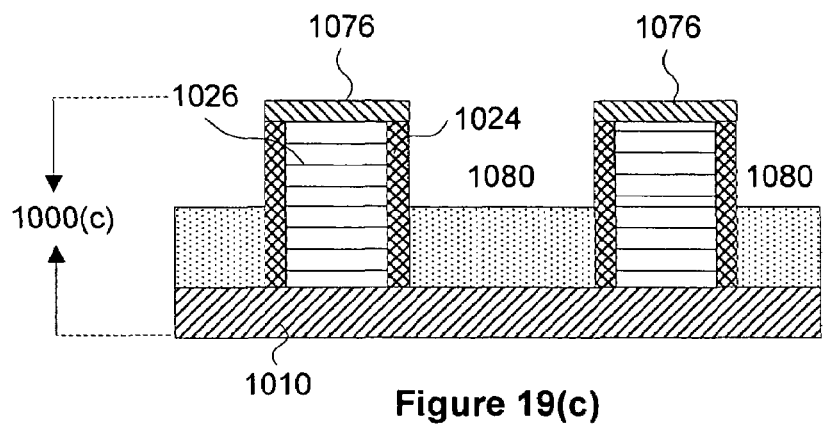

FIG. 19(c) shows an example structure 1000(c) which can be obtained through the performance of the process of removing material from the removal region of the second layered structure to define second deposition regions 960. As shown, the structure 1000(c) includes retention structures 1076 and second deposition regions 1080.

Figure 19D:
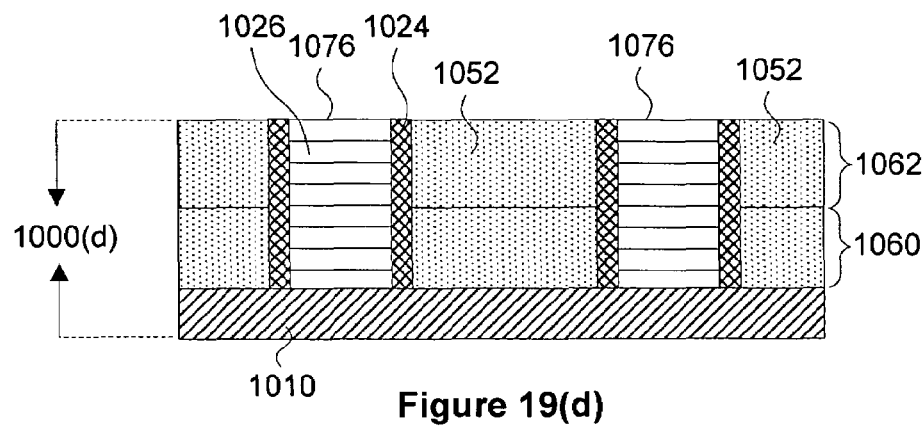

FIG. 19(d) shows an example structure 1000(d) which can be obtained through the performance of the processes of depositing a non-layered material into the second deposition regions to form a second composite structure 970 and shaping the second composite structure 980. As shown, the structure 1000(d) includes retention structures 1076, second non-layered elements 1052, and a second composite structure or level 1062.

Figure 19E:
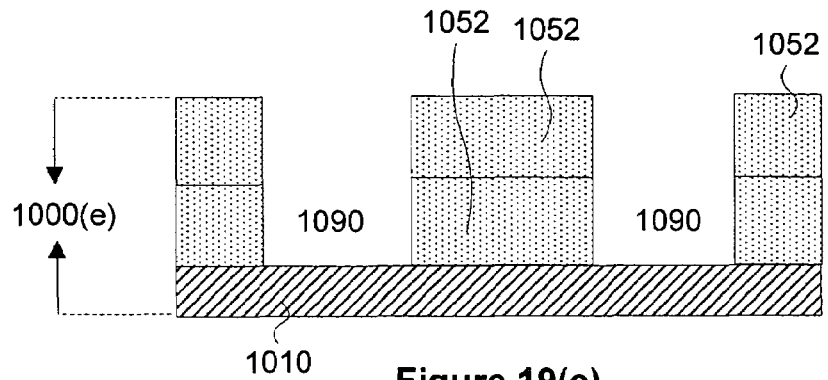

FIG. 19(e) shows an example structure 1000(e) which can be obtained through the performance of the process of removing the remaining portions of the first and second layered structures 990. As shown, the structure 1000(e) includes second non-layered elements 1052, and second deposition regions 1090.

Figure 19F:
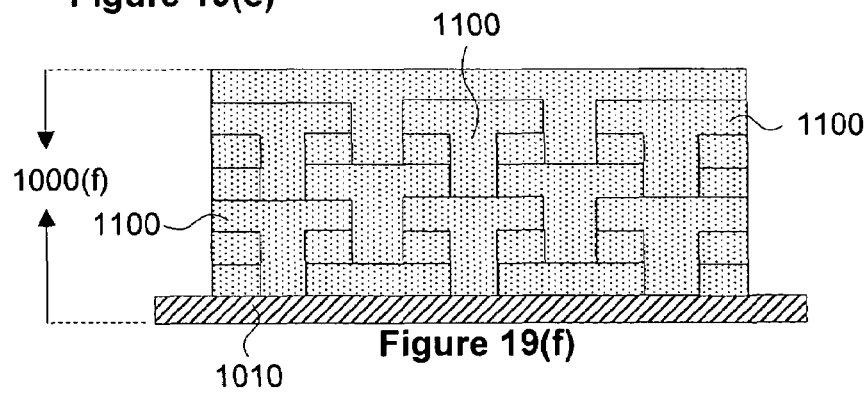

FIG. 19(f) shows an example structure 1000(f) which can be obtained through repeated performance of the processes of fabrication 900 and further deposition of non-layered material to achieve the extended interlaced elements 1100 shown.

It should be clear that through performance of combinations of the processes of the method 700 and method 900 detailed above a structure with varying amounts of interlacing between levels of non-layered elements can be achieved. In some embodiments on a given level the interlacing may be staggered such that some interlacing zones begin on the level and extend to the second level below, others begin on the level above and extend into the level below and some begin two levels above and extend down into the given level. In other embodiments other interlacing patterns may be made. In some embodiments, interlacing patterns may be tailored such that the patterning matches the level that has a reduced number of potential interlacing locations. Where it is not possible to have interlacing elements directly connect three levels, the interlacing may be reduced In some embodiments where the deposition voids are formed of varying width such that an undercut is created when filled function as rivet-like locks that allow material deposited in association with a given layer to grasp one or more previously formed layers. Such embodiments provide increased resistance to not only lateral loads by to forces out of the plane of the levels (e.g. delamination loads). The added mechanical bonding provided by such embodiment could significantly enhance integrity of the overall structure.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

| US Pat App No, Filing Date US App Pub No, Pub Date | Inventor, Title |
|---|---|
| 09/493,496 - Jan. 28, 2000 | Cohen, "Method For Electrochemical Fabrication" |
| 10/677,556 - Oct. 1, 2003 | Cohen, "Monolithic Structures Including Alignment and/or Retention Fixtures for Accepting Components" |
| 10/830,262 - Apr. 21, 2004 | Cohen, "Methods of Reducing Interlayer Discontinuities in Electrochemically Fabricated Three-Dimensional Structures" |
| 10/271,574 - Oct. 15, 2002 2003-0127336A - July 10, 2003 | Cohen, "Methods of and Apparatus for Making High Aspect Ratio Microelectromechanical Structures" |
| 10/697,597 - Dec. 20, 2002 | Lockard, "EFAB Methods and Apparatus Including Spray Metal or Powder Coating Processes" |
| 10/677,498 - Oct. 1, 2003 | Cohen, "Multi-cell Masks and Methods and Apparatus for Using Such Masks To Form Three-Dimensional Structures" |
| 10/724,513 - Nov. 26, 2003 | Cohen, "Non-Conformable Masks and Methods and Apparatus for Forming Three-Dimensional Structures" |
| 10/607,931 - Jun. 27, 2003 | Brown, "Miniature RF and Microwave Components and Methods for Fabricating Such Components" |
| 10/841,100 - May 7, 2004 | Cohen, "Electrochemical Fabrication Methods Including Use of Surface Treatments to Reduce Overplating and/or Planarization During Formation of Multi-layer Three-Dimensional Structures" |
| 10/387,958 - Mar. 13, 2003 2003-022168A - Dec. 4, 2003 | Cohen, "Electrochemical Fabrication Method and Application for Producing Three-Dimensional Structures Having Improved Surface Finish" |
| 10/434,494 - May 7, 2003 2004-0000489A - Jan. 1, 2004 | Zhang, "Methods and Apparatus for Monitoring Deposition Quality During Conformable Contact Mask Plating Operations" |
| 10/434,289 - May 7, 2003 20040065555A - Apr. 8, 2004 | Zhang, "Conformable Contact Masking Methods and Apparatus Utilizing In Situ Cathodic Activation of a Substrate" |
| 10/434,294 - May 7, 2003 2004-0065550A - Apr. 8, 2004 | Zhang, "Electrochemical Fabrication Methods With Enhanced Post Deposition Processing Enhanced Post Deposition Processing" |
| 10/434,295 - May 7, 2003 2004-0004001A - Jan. 8, 2004 | Cohen, "Method of and Apparatus for Forming Three-Dimensional Structures Integral With Semiconductor Based Circuitry" |
| 10/434,315 - May 7, 2003 2003-0234179 A - Dec. 25, 2003 | Bang, "Methods of and Apparatus for Molding Structures Using Sacrificial Metal Patterns" |
| 10/434,103 - May 7, 2004 2004-0020782A - Feb. 5, 2004 | Cohen, "Electrochemically Fabricated Hermetically Sealed Microstructures and Methods of and Apparatus for Producing Such Structures" |

-continued

| US Pat App No, Filing Date US App Pub No, Pub Date | Inventor, Title |
|---|---|
| 10/841,006 - May 7, 2004 | Thompson, "Electrochemically Fabricated Structures Having Dielectric or Active Bases and Methods of and Apparatus for Producing Such Structures" |
| 10/434,519 - May 7, 2003 2004-0007470A - Jan. 15, 2004 | Smalley, "Methods of and Apparatus for Electrochemically Fabricating Structures Via Interlaced Layers or Via Selective Etching and Filling of Voids" |
| 10/724,515 - Nov. 26, 2003 | Cohen, "Method for Electrochemically Forming Structures Including Non-Parallel Mating of Contact Masks and Substrates" |
| 10/841,300 - May 7, 2004 | Lockard, "Methods for Electrochemically Fabricating Structures Using Adhered Masks, Incorporating Dielectric Sheets, and/or Seed layers That Are Partially Removed Via Planarization" |
| 10/841,347 - May 7, 2004 | Cohen, "Multi-step Release Method for Electrochemically Fabricated Structures" |

Various other embodiments exist. Some of these embodiments may be based on a combination of the teachings herein with various teachings incorporated herein by reference. Some embodiments may not use any blanket deposition processes. Some embodiments may involve the selective deposition of a plurality of different materials on a single layer or on different layers. Some embodiments may use blanket depositions processes that are not electrodeposition processes. Some embodiments may use selective deposition processes on some layers that are not electrodeposition processes. Some embodiments may use one or more structural materials (e.g. nickel, gold, copper, or silver). Still other processes may use other materials whether or not electrodepositable. Some processes may use one or more sacrificial materials (e.g. copper). In some embodiments, a depth of deposition may be enhanced by separating a conformable contact mask away from the substrate as deposition is occurring in a manner that allows the seal between the conformable portion of the mask and the substrate to shift from the face of the conformal material to the inside edges of the conformable material.

In view of the teachings herein, many further embodiments, alternatives in design and uses are possible and will be apparent to those of skill in the art. As such, it is not intended that the invention be limited to the particular illustrative embodiments, alternatives, and uses described above but instead that it be solely limited by the claims presented hereafter.

We claim:
1. A method for forming a three-dimensional structure, comprising:
   (a) providing a substrate on which to build up multiple layers of multiple deposited materials;
   (b) depositing two or more materials to form a layer of desired cross-sectional configuration adhered to the substrate or a previous formed layer;
   (c) repeating the operation of (b) one or more times to build up a plurality of layers on the substrate, such that each layer has a desired cross-sectional configuration which when taken in combination with other cross-sectional configurations result in the formation of at least one removal region, occupied by at least one conductive removable material, that is multiple layers in thickness and that is in contact with a retention region where the contact between the at least one retention region and the at least one removal region is via a conductive barrier material,
   (d) removing material from the at least one removal region by a removal operation to form at least one multi-layer deposition region while not removing material from the at least one retention region as the barrier material inhibits the removal operation from accessing and removing any removable material located in the at least one retention region;
   (e) filling the deposition region with a desired structural material.
2. The method of claim 1 additionally comprising:
   (f) planarizing the structural material.
3. The method of claim 2 additionally comprising:
   (g) depositing one or more materials above the planarized structural material to form one or more additional layers of deposited material.
4. A method for forming a three-dimensional structure from a structural material, comprising:
   (a) forming a plurality of layers of multiple materials in a desired configuration, where at least one region of a first conductive material is separated from at least one region of a second conductive material by a conductive barrier material;
   (b) etching away the first conductive material from the at least one region of first conductive material, to create at least one void, wherein etching is inhibited from removing the second conductive material as a result of the second material being protected, at least in part, as a result of the configuration of the barrier material; and
   (c) filling the at least one void with a structural material having a desired three-dimensional configuration.
5. The method of claim 4 wherein the first and second conductive materials are the same.
6. The method of claim 4 additionally comprising:
   (d) repeating operations (a)-(c) one or more times to form the three-dimensional structure.
7. A method of fabricating a three-dimensional structure, comprising:
   (a) providing a layered structure defining a retention region and a removal region, wherein the removal region has a desired pattern and wherein the retention region comprises a first conductive material positioned to shield a second conductive material, wherein the removal region comprises the second conductive material;
   (b) due at least in rart to the shielding provided by the first conductive material, removing the second conductive material from the removal region, without removing the second conductive material from the retention region, to form a deposition region;
(c) depositing a desired material into the deposition region to form a region of desired material which has a thickness greater than one layer thickness; and
(d) planarizing the deposited desired material, such that the thickness of the desired material remains greater than one layer thickness and such that a desired configuration of the desired material is obtained,
wherein the first conductive material functions as a barrier material to protect the second conductive material in the retention region during removal of the second material from the removal region.

8. The method of claim 7, further comprising:
(e) encasing the desired material in a shield of the first conductive material.

9. The method of claim 8, further comprising:
(f) after encasing the desired material, removing the second conductive material from within at least a portion of the retention region.

10. The method of claim 9, further comprising:
(g) removing the first conductive material after encasing the desired material.

11. A method of fabricating a multi-layer structure, comprising:
(a) providing an initial deposition surface;
(b) defining locations for a plurality of layers where at least a first conductive material will be located and where at least a second conductive material will be located,
(c) forming a plurality of layers containing the first and second conductive materials by depositing the first and second conductive materials such that they are located in regions according to the defined locations and wherein the materials define at least one retention region and at least one removal region, wherein the second conductive material is a barrier material that protects the first conductive material located in the retention region;
(d) removing a portion of the first conductive material from the at least one removal region to form at least one multi-layer deposition region;
(e) depositing at least one desired material to fill the multi-layer deposition region;
(f) depositing a capping layer over the desired material; and
(g) after depositing the capping layer, removing at least a portion of the first conductive material located in the retention region.

12. The method of claim 11, wherein (c) additionally comprises forming at least one separation layer between the initial deposition surface and any deposition of the second conductive material.

13. The method of claim 12, wherein the separation layer is formed from the first conductive material.

14. A method for fabricating a three-dimensional structure having interlaced elements comprising:
(a) providing a layered structure having defined retention and removal regions;
(b) removing material from the removal regions to form deposition regions;
(c) depositing a non-layered material into the deposition regions to form a composite structure;
(d) shaping the composite structure;
(e) removing layered structure to define interlace deposition region(s);
(f) depositing a sacrificial material and then sharing the sacrificial material to define an interface removal region;
(g) repeating the steps (a)-(f) one or more times to create a structure from multiple deposits of the non-layered material where successive deposits of the multiple deposits of non-layer material form successive interlaced elements, and wherein the repetition or repetitions of step (a) form the layered structure on previously deposited conductive sacrificial material and non-layered material;
(h) after step (g), removing the conductive sacrificial material; and
(i) depositing a non-layered capping structure, wherein the removal regions are formed from a conductive second material while retention regions are formed from the conductive second material and a conductive first material and wherein the conductive first material provides a barrier that separates the conductive second material in the removal regions from the conductive second material in the retention regions.

15. A method for fabricating extended interlaced elements comprising:
(a) providing a first layered structure having defined retention and removal regions;
(b) removing material from the removal region(s) to form first deposition regions;
(c) depositing a non-layered material into the deposition region(s) to form a first composite structure;
(d) shaping the first composite structure;
(e) providing a second layered structure having defined retention and removal regions on the shaped first composite structure;
(f) removing material from the removal region of the second layered structure to define second deposition regions;
(g) depositing a non-layered material into the second deposition regions to form a second composite structure;
(h) shaping the second composite structure; and
(i) after formation of the first composite structure and the second composite structure, removing the remaining portions of the first and second layered structures,
wherein the removal regions of the first layered structure and the second layered structure are formed from a conductive second material while retention regions of the first layered structure and the second layered structure are formed from the conductive second material and a conductive first material and wherein the conductive first material provides a barrier that separates the conductive second material in the removal regions of the first layered structure from the conductive second material in the retention regions of the first layered structure and wherein the conductive first material provides a barrier that separates the conductive second material in the removal regions of the second layered structure from the conductive second material in the retention regions of the second layered structure.

* * * * *